United States Patent [19]
Yamazaki

[11] Patent Number: 6,029,210
[45] Date of Patent: Feb. 22, 2000

[54] MEMORY INITIALIZATION SYSTEM SELECTIVELY OUTPUTTING A DATA BETWEEN A NORMAL DATA STORED IN THE MEMORY AND A FIXED VALUE ACCORDING TO A REGISTERED ACCESS STATE

[75] Inventor: Naōmi Yamazaki, Kawasaki, Japan

[73] Assignee: Fujitsu Limited, Kawasaki, Japan

[21] Appl. No.: 08/991,339

[22] Filed: Dec. 16, 1997

[30] Foreign Application Priority Data

May 2, 1997 [JP] Japan ..................................... 9-114508

[51] Int. Cl.[7] ............................ G06F 13/10; G06F 13/16; G06F 1/24; G06F 12/00
[52] U.S. Cl. ................................ 710/10; 710/19; 710/51; 711/156; 711/163; 711/166
[58] Field of Search .................................. 710/10, 19, 51; 711/166, 163, 156

[56] References Cited

U.S. PATENT DOCUMENTS

| | | | |
|---|---|---|---|
| 4,720,819 | 1/1988 | Pinkham et al. | 365/219 |
| 5,638,536 | 6/1997 | Nakai et al. | 711/166 |
| 5,777,999 | 7/1998 | Hiraki et al. | 370/509 |

FOREIGN PATENT DOCUMENTS

| | | |
|---|---|---|
| 361090241A | 5/1986 | Japan . |
| 61-118792 | 6/1986 | Japan . |
| 3-48952 | 3/1991 | Japan . |
| 8-123951 | 5/1996 | Japan . |

Primary Examiner—Thomas C. Lee
Assistant Examiner—Ilwoo Park
Attorney, Agent, or Firm—Staas & Halsey LLP

[57] ABSTRACT

When normal data is written to a desired address in a DRAM, a guarantee bit comparing/generating circuit sets the value of guarantee bit data stored at the address corresponding to the desired address in a DRAM as a value indicating that the normal data has been written. Since the guarantee bit data stored at each address in the DRAM always becomes "000" or "111" immediately after power is turned on, the above described value indicating that the normal data has been written is set as a value other than "000" and "111". Thereafter, if the value of the guarantee bit data stored at the address corresponding to the desired address in the DRAM indicates that the normal data has been written when the normal data is read from the desired address in the DRAM, the normal data read from the DRAM is output to a data bus. Otherwise, the fixed value "0" is output to the data bus as read data.

16 Claims, 12 Drawing Sheets

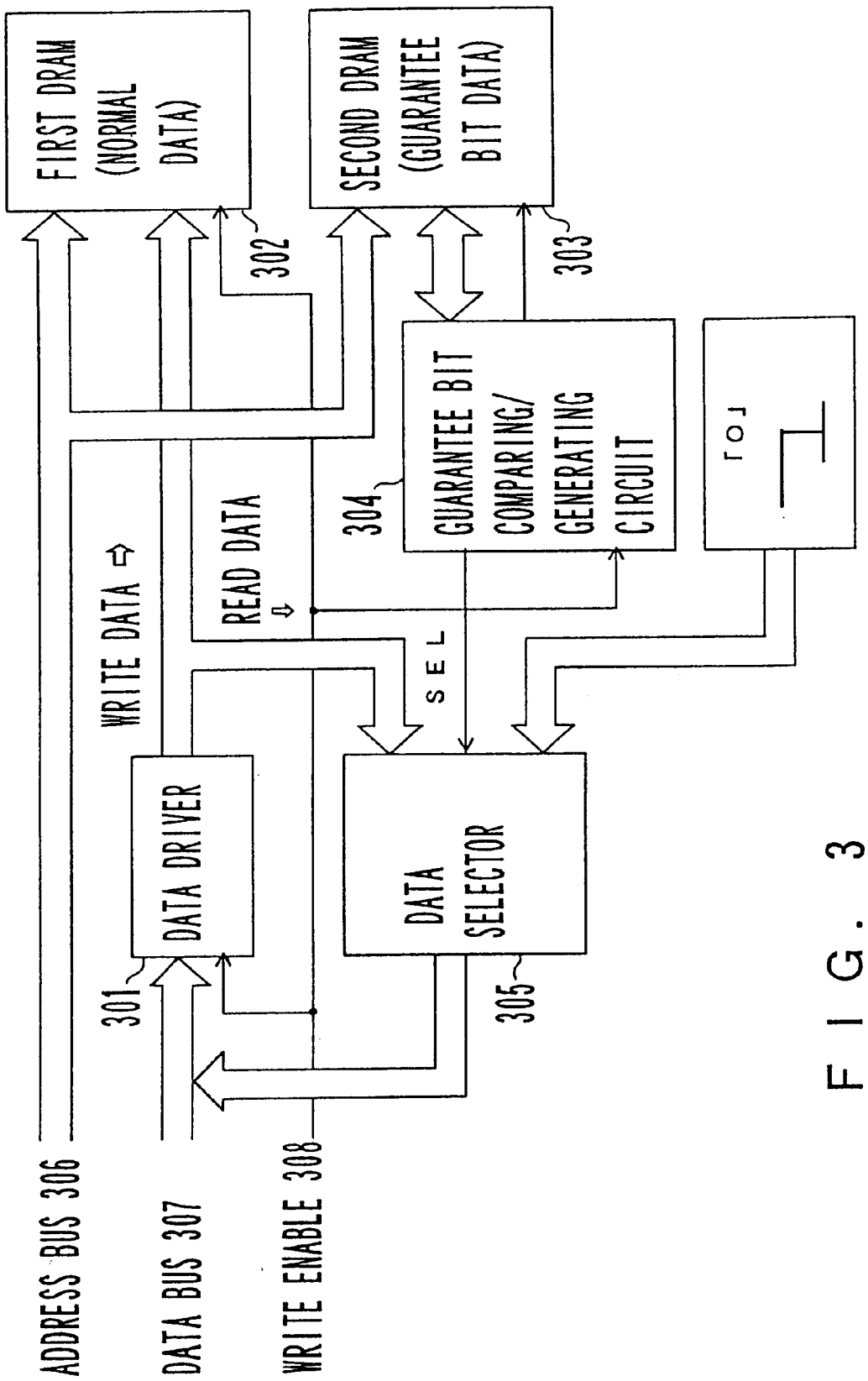
F I G. 3

FIG. 4A — SET DATA SET IN FIRST CONTROL STATE

| SET DATA AT TIME OF WRITE OPERATION | | | SET DATA AT TIME OF READ OPERATION | | |
|---|---|---|---|---|---|
| b2 | b1 | b0 | b2 | b1 | b0 |
| 0 | 0 | 1 | 1 | 0 | 1 |

FIG. 4B — GUARANTEE BIT DATA AT TIME OF WRITE OPERATION IN FIRST CONTROL STATE

| | READ DATA | | | WRITE DATA | | |
|---|---|---|---|---|---|---|
| | b2 | b1 | b0 | b2 | b1 | b0 |
| (1) (INITIAL STATE) | 0 | 0 | 1 | 0 | 0 | 1 |
| (2) (INITIAL STATE) | 1 | 0 | 1 | 1 | 0 | 1 |
| (3) (AFTER ONLY WRITE OPERATION IS PERFORMED) | 0 | 0 | 1 | 0 | 0 | 1 |
| (4) (AFTER ONLY WRITE OPERATION OR WRITE AND READ OPERATIONS ARE PERFORMED) | 1 | 0 | 1 | 1 | 0 | 1 |
| (5) (AFTER ONLY READ OPERATION IS PERFORMED) | 1 | 0 | 0 | 1 | 0 | 1 |
| (6) (INITIAL STATE AFTER SECOND CONTROL STATE) | 0 | 1 | 0 | 0 | 0 | 1 |

FIG. 4C — GUARANTEE BIT DATA AT TIME OF READ OPERATION IN FIRST CONTROL STATE

| | READ DATA | | | WRITE DATA | | |
|---|---|---|---|---|---|---|
| | b2 | b1 | b0 | b2 | b1 | b0 |
| (1) (INITIAL STATE) | 0 | 0 | 0 | | | |
| *(2) (INITIAL STATE) | 1 | 0 | 1 | 1 | 1 | 0 |
| (3) (AFTER ONLY READ OPERATION IS PERFORMED) | 1 | 0 | 0 | 1 | 1 | 0 |
| (4) (AFTER ONLY WRITE OPERATION IS PERFORMED) | 0 | 0 | 1 | 1 | 1 | 0 |
| (5) (AFTER ONLY WRITE OPERATION OR WRITE AND READ OPERATIONS ARE PERFORMED) | 1 | 0 | 1 | 1 | 1 | 0 |
| (6) (INITIAL STATE AFTER SECOND CONTROL STATE) | 0 | 1 | 0 | 1 | 1 | 0 |

* (2) INDICATES EXCEPTION PROCESS

FIG. 4D

| SET DATA SET IN SECOND CONTROL STATE | |  | SET DATA AT TIME OF READ OPERATION | | |
|---|---|---|---|---|---|
| SET DATA AT TIME OF WRITE OPERATION | | | | | |
| b2 | b1 | b0 | b2 | b1 | b0 |
| c | 1 | c | 0 | c | 0 |

FIG. 4E

GUARANTEE BIT DATA AT TIME OF WRITE OPERATION IN SECOND CONTROL STATE

| | READ DATA | | | WRITE DATA | | |
|---|---|---|---|---|---|---|
| | b2 | b1 | b0 | b2 | b1 | b0 |
| (1) (INITIAL STATE AFTER FIRST CONTROL STATE) | 1 | 0 | 0 | 1 | 1 | 0 |
| (2) (INITIAL STATE AFTER FIRST CONTROL STATE) | 1 | 0 | 1 | 1 | 1 | 1 |
| (3) (AFTER ONLY WRITE OPERATION IS PERFORMED) | 1 | 1 | 0 | 1 | 1 | 0 |
| (4) (AFTER ONLY WRITE OPERATION IS PERFORMED) | 1 | 1 | 1 | 1 | 1 | 1 |
| (5) (AFTER ONLY READ OPERATION IS PERFORMED) | 0 | 0 | 0 | 0 | 1 | 0 |
| (6) (AFTER READ AND WRITE OPERATIONS ARE PERFORMED) | 0 | 1 | 0 | 0 | 1 | 0 |

FIG. 4F

GUARANTEE BIT DATA AT TIME OF READ OPERATION IN SECOND CONTROL STATE

| | READ DATA | | | WRITE DATA | | |
|---|---|---|---|---|---|---|
| | b2 | b1 | b0 | b2 | b1 | b0 |
| (1) (INITIAL STATE AFTER FIRST CONTROL STATE) | 1 | 0 | 0 | 0 | 0 | 0 |
| (2) (INITIAL STATE AFTER FIRST CONTROL STATE) | 1 | 0 | 1 | 0 | 0 | 0 |
| (3) (AFTER ONLY READ OPERATION IS PERFORMED) | 0 | 0 | 0 | 0 | 0 | 0 |
| (4) (AFTER ONLY WRITE OPERATION IS PERFORMED) | 1 | 1 | 1 | 0 | 1 | 0 |
| (5) (AFTER ONLY WRITE OPERATION IS PERFORMED) | 1 | 1 | 0 | 0 | 1 | 0 |
| (6) (AFTER READ AND WRITE OPERATIONS ARE PERFORMED) | 0 | 1 | 0 | 0 | 1 | 0 |

MEMORY INITIALIZATION SYSTEM SELECTIVELY OUTPUTTING A DATA BETWEEN A NORMAL DATA STORED IN THE MEMORY AND A FIXED VALUE ACCORDING TO A REGISTERED ACCESS STATE

BACKGROUND OF THE INVENTION

1. Field of the Invention

The present invention relates to a technology for initializing contents stored in a memory.

2. Description of the Related Art

For a system employing a microprocessor as a central processing unit (CPU), peripheral circuits such as a program ROM, a RAM, input/output control devices (I/O), etc. are connected to the CPU via various buses such as an address bus, a data bus, a control bus, etc. When a system is started up, or each process type is invoked, data remaining in the peripheral circuits are initialized by performing an initialization process. As a result, erroneous information processing is prevented.

In recent years, CPUs have been almost always used to realize various systems. Particularly, the scale of a system has recently increased with the improvement in a throughput of a CPU. Furthermore, a storage capacity of a memory included in a system tends to increase in image/picture processing applications which are handling large amounts of information. A storage capacity of tens of megabytes has become popular. As the storage capacity of a memory to be included in a system increases, the amount of time required to perform the process for initializing the memory at a system start-up, etc. becomes longer. Consequently, a considerable amount of time is required to complete the system start-up.

Assume that one clock cycle is 250 nanoseconds and the contents of 16 megabytes of memory are to be initialized. In this case, approximately 4.2 seconds are required using a byte access method, while approximately 2.1 seconds are required using a word access method.

Furthermore, if initialization is performed as a software process, the amount of time including the number of steps performed for the initialization is required.

An independently operating system such as a stand-alone machine, etc. has little influence on an ambient system environment even if a considerable amount of time is required to start up the system.

For a system which is connected to a network or to another system and provides various services, however, the provision of the services is delayed if a considerable amount of time is required to start up the system. This may sometimes lead to a system crash of another system connected to the network, or to the system which requested the above described services.

Also to avoid such problems, a system must be quickly started up, and the process for initializing a memory with a large storage capacity must be quickly completed.

For a conventional system using a CPU, the CPU and memories such as a ROM, a RAM, etc. are connected as shown in FIG. 1. Typically, a memory initialization routine stored in the ROM (program ROM) is called, and the CPU directly writes "0" to each storage area in the memory, when the initialization process is performed.

Furthermore, there is also a hardware initialization method with which particular hardware such as an address counter, a write control circuit, etc. are equipped separately from the function operating based on an address accessed by the CPU, and "0" is written to each storage area in the memory by starting up the address counter and the write control circuit when the initialization process is performed.

The object of the initialization process is to guarantee that the value of memory data is set to a particular value (normally "0") when a CPU or peripheral I/O devices initially read data stored in a memory.

However, the above described conventional method with which a CPU executes the initialization routine stored in a ROM, or the method with which particular hardware executes the initialization process, has the problem that the amount of time required for initializing a memory increases in proportion to the storage capacity of the memory. That is, if the storage capacity of the memory becomes double, also the amount of time required for initializing the memory will become double.

Furthermore, with a conventional data rewrite system for an image memory, etc., which enables data to be rewritten in a RAM after data stored in a ROM is transferred to the RAM, the above described rewrite process is started after the amount of time required for the data transfer elapses. Therefore, this system also has the problem that the amount of time until it becomes possible to perform the process for rewriting the RAM increases in proportion to the storage capacity of the RAM.

SUMMARY OF THE INVENTION

The present invention was developed due to the above described background. It aims at eliminating the need for performing the process for initializing the contents stored in a memory when a system is started up or each process type is invoked.

A first embodiment of the present invention assumes a memory initialization control method for initializing the contents stored in a memory.

First of all, an access state of a memory is registered.

Then, the method alternatively switches between an output of data stored in the memory and an output of a fixed value, according to the registered access state.

With the above described method according to the present invention, a fixed value (such as "0") can always be output from an address in a memory, whose contents are not rewritten, without performing the process for initializing a memory, thereby implementing a virtual memory clear operation.

A second embodiment of the present invention has the following configuration.

This embodiment assumes a memory device having a means for initializing the contents stored in a memory.

An access guarantee data storing circuit (second DRAM 303 or 508) is arranged separately from a normal data storing circuit for storing normal data (first DRAM 302 or 507). It can specify an address corresponding one to one to an address in the normal data storing circuit, and stores access guarantee data indicating an access state of the normal data to an address in the normal data storing circuit, which corresponds to each address, at each address.

A first control circuit (a guarantee bit comparing/generating circuit 304, a read modify write timing generating circuit 509, a data-at-read register 523, a data-at-write register 522, a NAND circuit 530, and an input gate 531) sets the access guarantee data corresponding to an access at the address in the access guarantee data storing circuit, which corresponds to a desired address, when the normal data access is made to the desired address in the normal data storing circuit. For example, the first control circuit sets the access guarantee data including the information indicating that the normal data has been written to an address in the access guarantee data storing circuit, which corresponds to the desired address, when the normal data has been written to the desired address in the normal data storing circuit. Additionally, the first control circuit may further set the access guarantee data including the information indicating that the normal data is read at the address in the access guarantee data storing circuit, which corresponds to the desired address, when the normal data is read from the desired address in the normal data storing circuit.

A second control circuit (a guarantee bit comparing/generating circuit 304, a latch 516, bit masking circuits 517 and 518, a bit comparing circuit 519, a comparison data register 520, a comparison bit register 521, and a selector 513) determines whether or not to select and output the normal data at the address in the normal data storing circuit, which corresponds to a desired address, based on the access guarantee data stored at the address in the access guarantee data storing circuit, which corresponds to the desired address, when the normal data is read from the desired address in the normal data storing circuit. More specifically, the second control circuit selects and outputs the normal data stored at the address in the normal data storing circuit, which corresponds to the desired address, only if the access guarantee data stored at the address in the access guarantee data storing circuit, which corresponds to the desired address, includes the information indicating that the normal data has been written, when it reads the normal data from the desired address in the normal data storing circuit. Additionally, the second control circuit selects and outputs set value data or default data stored in a default data storing circuit if the access guarantee data stored at the address in the access guarantee data storing circuit, which corresponds to the desired address, does not include the information indicating that the normal data has been written, when it reads the normal data from the desired address in the normal data storing circuit.

With the above described configuration according to the present invention, a fixed value (such as "0") can be always output from an address in the normal data storing circuit, whose content is not rewritten, without performing the initialization process for the normal data storing circuit, thereby implementing a virtual memory clear operation.

Additionally, not a fixed value but a default value from a particular ROM, etc. is output from an address in the normal data storing circuit, whose content is not rewritten, so that, for example, the data in the ROM can be set as default data and only a stored content which is rewritten is read from a RAM. This process allows a programmable ROM, etc. to be implemented, for example, without transferring the contents of the ROM to the RAM.

With the above described configuration according to the present invention, the access guarantee data storing circuit may be a dynamic random access memory. The information indicating that normal data has been written, which is included in the access guarantee data, may have a data value which does not appear at each address in the access guarantee data storing circuit when the memory device is powered up.

This configuration according to the present invention allows a memory system which can significantly reduce an initialization time to be implemented by cheap DRAMs.

The information indicating that normal data has been written, which is included in the access guarantee data, may be sum check data or cyclic redundancy code data obtained by performing a sum check operation or a cyclic redundancy code operation for that normal data. The second control circuit performs the sum check operation or the cyclic redundancy code operation for the read normal data when it reads the normal data from a desired address in the normal data storing circuit. Only when the result of the operation matches the sum check data or the cyclic redundancy code data, which is the access guarantee data stored at the address in the access guarantee data storing circuit, which corresponds to the desired address, may the second control circuit select and output the normal data read from the normal data storing circuit.

Also this configuration according to the present invention allows a memory system which can significantly reduce an initialization time to be implemented by using cheap memory elements.

The above described configuration according to the present invention may further include a control data switching circuit (a comparison data register 520, a comparison bit register 521, a data-at-read register 523, and a data-at-write register 522) for switching a combination of a data value of the information indicating that normal data has been written and a determination value by which the second control circuit detects the information indicating that the normal data has been written, among a plurality of combinations, so that the entire contents stored in the normal data storing circuit are instantaneously cleared by the switching operation performed by the control data switching circuit.

With this configuration according to the present invention, a memory clear operation of the entire storage area in the normal data storing circuit can be implemented by only performing the operation for switching a combination of the data value of the information indicating that normal data has been written, and the determination value by which the second control circuit detects the information indicating that the normal data has been written. As a result, it becomes possible to instantaneously clear the contents stored in an image memory, etc.

Furthermore, the combination of the data value of the information indicating that normal data has been written and the determination value by which the second control circuit detects the information indicating that the normal data was written, may be set and switched for each of a plurality of address areas in the normal data storing circuit and the access guarantee data storing circuit, so that the contents stored in each of the plurality of address areas can be instantaneously cleared.

With this configuration according to the present invention, stored contents can be instantaneously cleared for each of a plurality of address areas in the normal data storing circuit.

A third embodiment according to the present invention has the following configuration.

A counter circuit (counter 912) increments its value each time normal data is written to a normal data storing circuit (first RAM 901) for storing normal data.

A count value storing circuit (second RAM 902) is arranged separately from the normal data storing circuit. It can specify an address corresponding to an address in the normal data storing circuit one by one, and stores the count value of the counter circuit at each address.

An address data storing circuit (third RAM 903) is arranged separately from the normal data storing circuit and the count value storing circuit. It can specify an address corresponding to the count value of the counter circuit one by one, and stores the address data corresponding to the address specified for the normal data storing circuit.

A third control circuit (input gate 907) writes a current count value of the counter circuit at an address in the count value storing circuit corresponding to a desired address, when it writes normal data to a desired address in the normal data storing circuit.

A fourth control circuit (a selector 911 and an input gate 908) writes address data corresponding to a desired address at an address corresponding to the current count value of the counter circuit in the address data storing circuit, when it writes the normal data to the desired address in the normal data storing circuit.

A fifth control circuit (a first comparing circuit 918, a second comparing circuit 919, an AND circuit 917, and a selector 910) decides whether or not to select and output the normal data stored at the address corresponding to a desired address in the normal data storing circuit, based on the current count value, the count value stored at the address in the count value storing circuit, which corresponds to the desired address, and the address data stored at the address in the address data storing circuit, which corresponds to the stored count value, when it reads the normal data from the desired address in the normal data storing circuit. More specifically, the fifth control circuit selects and outputs the normal data read from the normal data storing circuit only if the current count value of the counter circuit is not "0", and the count value stored at the address in the count value storing circuit, which corresponds to the desired address, is smaller than the current count value of the counter circuit and matches the desired address indicated by the address data stored at the address in the address data storing circuit, which corresponds to the stored count value.

With the above described configuration according to the present invention, an instantaneous memory clear operation can be implemented also for an arbitrary memory element other than a DRAM, whose contents are not guaranteed immediately after the memory device is powered up.

BRIEF DESCRIPTION OF THE DRAWINGS

One skilled in the art can easily understand additional features and objects of the present invention from the description of the preferred embodiments and some of the attached drawings. In the drawings:

FIGS. 2A and 2B are schematic diagrams showing the structures of a memory LSI;

FIG. 3 is a schematic diagram showing the principle of first and second preferred embodiments;

FIGS. 4A through 4F are schematic diagrams explaining guarantee bit data;

DESCRIPTION OF THE PREFERRED EMBODIMENTS

Figure 1:
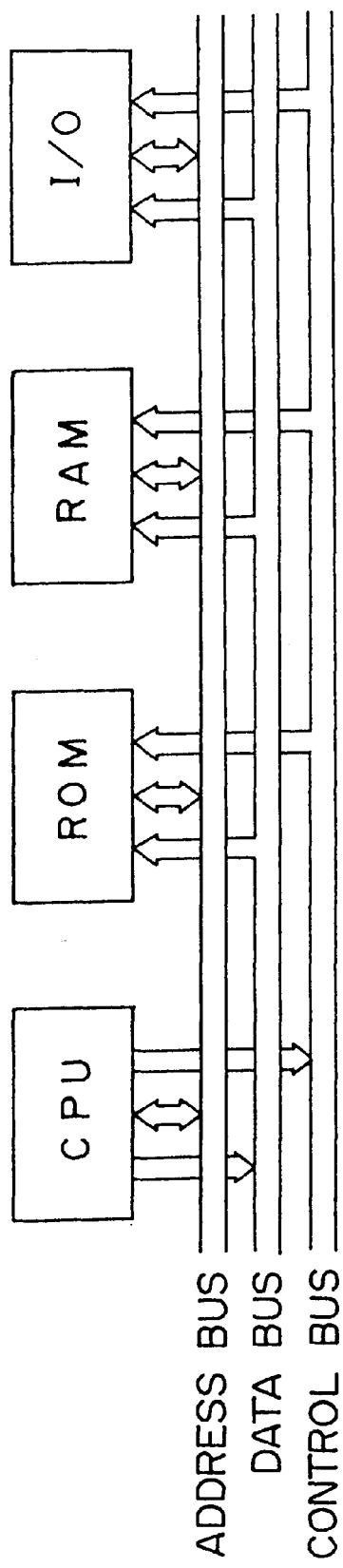
FIG. 1 is a schematic diagram showing the configuration of a microprocessor system.

Provided below are the explanations about the details of each of the preferred embodiments according to the present invention, with reference to the drawings.

<First Preferred Embodiment>

Figures 2A, 2B:
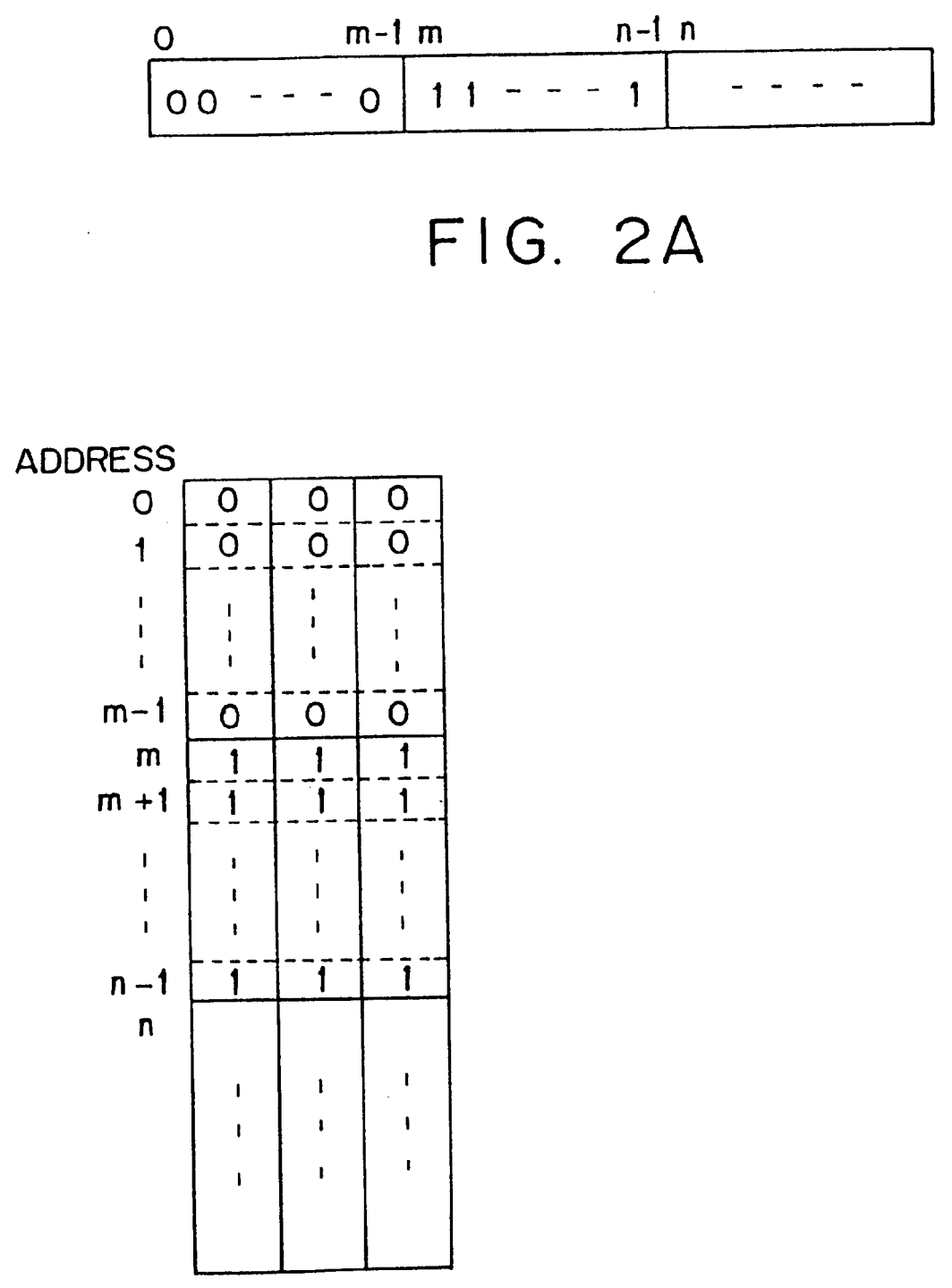

FIG. 2A is a schematic diagram showing the structures of a memory LSI chip used in the first preferred embodiment.

This memory LSI chip is a dynamic RAM (DRAM) chip.

This DRAM chip can perform a read or write operation for a particular 1-bit storage area by being provided with a row address signal (RAS) and a column address signal (CAS).

The DRAM includes a "true cell" whose stored state of internal data is the same as the state of data input from the outside or data output to the outside, and a "not cell" whose stored state of internal data is reversed.

Although the arrangements of these two types of cells are different depending on a DRAM type, DRAMs are normally and regularly arranged. Therefore, if no input is made to cells when power is turned on, an address area from which "0" is output and an address area from which "1" is output exist according to the arrangement of the "not cell" and the "true cell", as shown in FIG. 2A.

According to the first preferred embodiment, three DRAM chips having the above described characteristics are arranged side by side as shown in FIG. 2B, so that a particular memory element whose access unit (address) is, for example, 3 bits, can be implemented.

As the feature of this memory element, 3-bit data at each address of the memory element structured as shown in FIG. 2B always becomes either of "000" and "111" when power is turned on, due to the characteristics of the DRAM chip explained by referring to FIG. 2A.

FIG. 3 is a schematic diagram showing the principle of the first preferred embodiment according to the present invention, which employs the above described particular memory element.

In this figure, a second DRAM 303 corresponds to the particular memory element shown in FIG. 2B, and stores 3-bit data (hereinafter referred to as guarantee bit data) at each address.

A first DRAM 302 stores normal data, and each of its addresses corresponds to each address in the second DRAM 303.

According to the first preferred embodiment of the present invention, when normal data is newly written to a desired address in the first DRAM 302, the value of the guarantee bit data stored at the address in the second DRAM 303, which corresponds to the desired address, is set to a value indicating that the normal data has been written. The guarantee bit data stored at each address in the second DRAM 303 always becomes either of "000" and "111" immediately after power is turned on, as described above by referring to FIG. 2A. Therefore, the value indicating that the normal data has been written is set as a value other than "000" and "111" (the specific example will be described later by referring to FIG. 4). Thereafter, when the normal data is read from a desired address in the first DRAM 302, the normal data read from the first DRAM 302 is output to the data bus 307 as read data if the value of the guarantee bit data stored at the address in the second DRAM 303, which corresponds to the desired address, indicates that the normal data has been written. If the value of the guarantee bit data does not indicate that the normal data has been written, the fixed value "0" is forcibly output to the data bus as the read data.

As described above, the fixed value "0" is always output from an address in the first DRAM 302, whose contents have not been rewritten, without performing an initialization process for the first DRAM 302. As a result, a virtual memory clear operation can be implemented. This is the feature related to the present invention.

Provided below is the explanation about the details of the operations performed in the first preferred embodiment.

Assume that a CPU, which is not shown in FIG. 3, outputs address data for accessing the first DRAM 302 and write data which is normal data to the address bus 306 and the data bus 307, respectively, and at the same time, it specifies a write operation by making a write enable signal 308 active. As a result, the address data is input from the address bus 306 to the first DRAM 302, and the write data is input to the first DRAM 302 via a data driver 301 (which operates when the write enable signal 308 is made active). Then, the write data is written to the address in the first DRAM 302, which corresponds to the address data.

At the same time, the address data is input also to the second DRAM 303, so that the address in the second DRAM 303, which corresponds to the address data, is specified.

The guarantee bit comparing/generating circuit 304 writes set data "n01" appearing in the left column of FIG. 4A to the above described address in the second DRAM 303 when the write enable signal 308 is active, in the first control state. Here, "n" indicates that the bit specified by "n" itself (the bit b2 in this case) is not rewritten. That is, the values of the bit "b1" and the bit "b0" (the least significant bit) are respectively changed to "0" and "1", and the value of the bit "b2" (the most significant bit) is left unchanged in the guarantee bit data stored at the above described address in the second DRAM 303.

With the guarantee bit control operation when the write operation is performed in the first control state, if the contents of the guarantee bit data at a desired address in the second DRAM 303 are the initial state "000" as shown in FIG. 4B(1) and the write operation is performed for that address, the values of the guarantee bit data are changed to "001".

Furthermore, as shown in FIG. 4B(2), in the case of the contents of the guarantee bit data at the desired address in the second DRAM 303 is the initial value state "111" if the write operation is performed for that address, the values of the guarantee bit data are changed to "101".

Still further, as shown in FIG. 4B(3), in the case of the contents of the guarantee bit data at the desired address in the second DRAM 303 is the state "001" after only the write operation is performed (in FIGS. 4B(1) and 4B(3)), if the read operation is performed for that address, the values of the guarantee bit data are left unchanged.

Still further, as shown in FIG. 4B(4), in the case of the contents of the guarantee bit data at the desired address in the second DRAM 303 is the state "101" after only the write operation is performed or the state after the read and write operations are performed (in FIGS. 4B(2), 4B(4), and 4B(5) to be described later, and FIGS. 4C(4) and 4C(5) to be described later), if the write operation is performed for that address, the values of the guarantee bit data are left unchanged.

Still further, as shown in FIG. 4B(5), in the case of the contents of the guarantee bit data at the desired address in the second DRAM 303 is the state "100" after only the read operation is performed, (in FIG. 4B(5), and FIGS. 4C(1), 4C(2), and 4C(3) to be described later), if the write operation is performed for that address, the values of the guarantee bit data are changed to "101".

FIG. 4B(6) will be described later.

If the CPU, which is not shown in FIG. 3, outputs the address data for accessing the first DRAM 302 to the address bus 306, and at the same time, it specifies the read operation by making the write enable signal 308 inactive, the address data is input also to the second DRAM 303, so that the address in the second DRAM 303, which corresponds to the address data, is specified.

The guarantee bit comparing/generating circuit 304 writes the set data "10n" appearing in the right column of FIG. 4A to the address in the second DRAM 303 if the write enable signal 308 is active, in the first control state. As a result, the values of the bits "b2" and "b1" in the guarantee bit data stored at the above described address in the second DRAM 303 are respectively changed to "1" and "0". The value of the bit "b0" is left unchanged.

With the guarantee bit data control operation when the read operation is performed in the first control state, the values of the guarantee bit data are changed to "100" when the contents of the guarantee bit data at the desired address in the second DRAM 303 is the initial state "000" as shown in FIG. 4C(1) and the read operation is performed for that address.

Figure 5:
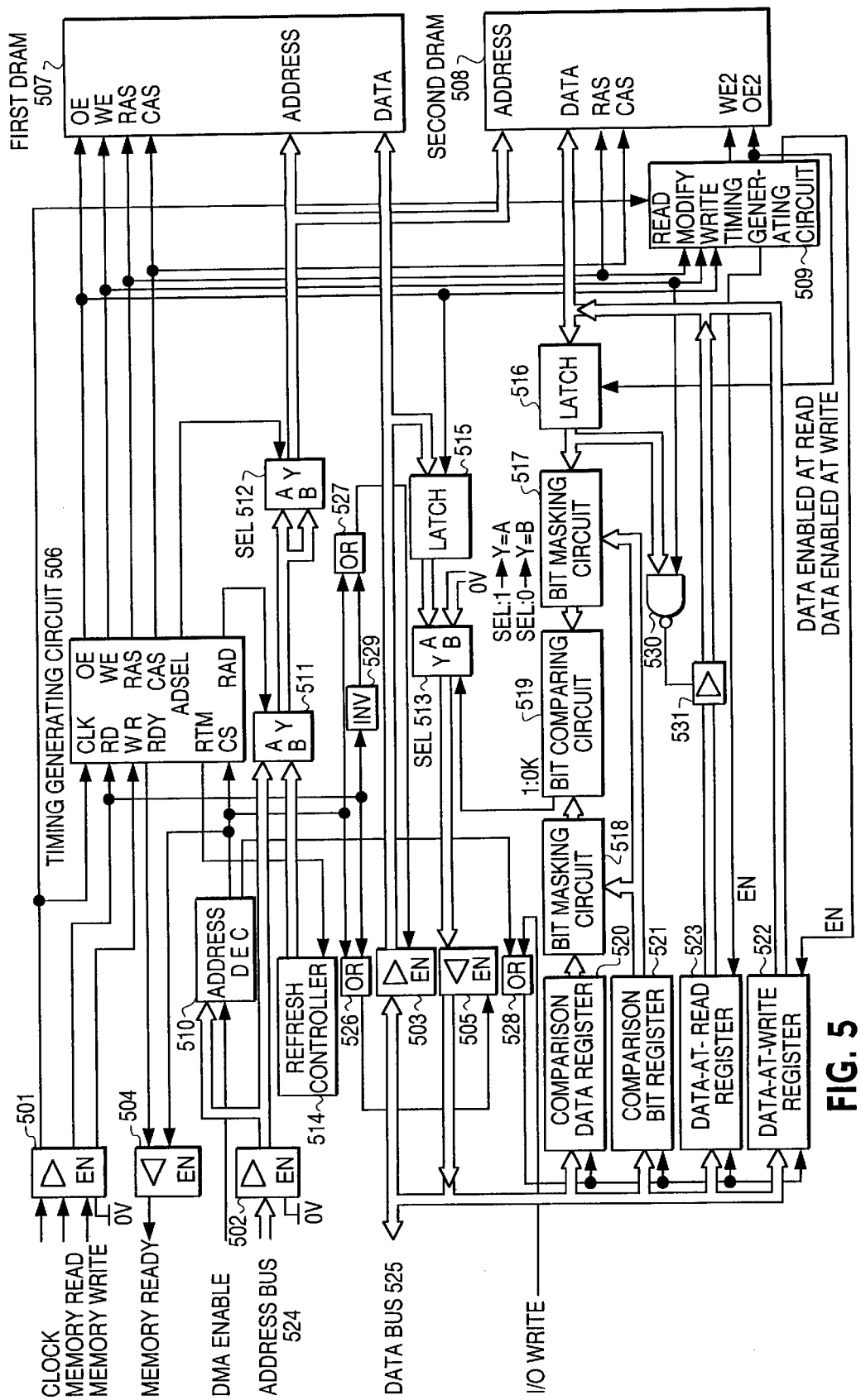
FIG. 5 is a schematic diagram showing the first preferred embodiment.

Furthermore, as shown in FIG. 4C(2), if the contents of the guarantee bit data at the desired address in the second DRAM 303 is the initial value state "111", the values of the guarantee bit data are exceptionally changed to "100" when the read operation is performed for that address. To implement this exceptional process, as shown in FIG. 5, a NAND circuit 530 to which a 3-bit output value of a latch 516 and a write enable signal WE are input, and a gate circuit 531 controlled by an output of the NAND circuit 530 are arranged. The NAND circuit 530 outputs "0" only when all of the current values of the guarantee bit data in the second RAM 508, which are latched by the latch 516, are "1", and the write enable signal WE is inactive (high level="1") at the time of the read operation. If the output of the NAND circuit 530 is "1", the gate circuit 531 passes the output values of the data-at-read register 523 unchanged. If the output of the NAND gate 530 is "0", the gate circuit 531 changes the value of the bit "b0" (LSB) of the output values of the data-at-read register 523 to "0", and outputs the values. Consequently, the guarantee bit data having the values "100" is written to the above described address in the second DRAM 508.

Still further, as shown in FIG. 4C(3), in the case of the contents of the guarantee bit data at the desired address in the second DRAM 303 is the state "100" after only the read operation is performed (in FIGS. 4C(1), 4C(2), and 4C(3)), if the read operation is performed for that address, the values of the guarantee bit data are left unchanged.

Still further, as shown in FIG. 4C(4), in the case of the contents of the guarantee bit data at the desired address in the second DRAM 303 is "001" after only the write operation is performed (in FIGS. 4B(1) and 4B(3)), if the write operation is performed for that address, the values of the guarantee bit data are changed to "101".

Still further, as shown in FIG. 4C(5), in the case of the contents of the guarantee bit data at the desired address in the second DRAM 303 is "101" after only the write operation is performed or the state after the read and write operations are performed (in FIGS. 4B(2), 4B(4), 4B(5), 4C(4), and 4C(5)), if the write operation is performed for that address, the values of the guarantee bit data are left unchanged.

FIG. 4C(6) will be described later.

As is known from the above described details of the guarantee bit data control operations when the read and write operations are performed in the first control state, the lowest two bits ("b1" and "b0") of the guarantee bit data stored at the address in the second DRAM 303, which correspond to a desired address, are always changed to "01", when normal data is written to the desired address in the first DRAM 302, as shown in FIGS. 4B(1) through 4B(6) and FIGS. 4C(4)

and 4C(5). Conversely, if the lowest two bits of the guarantee bit data are "01", it is proved that the write operations was certainly performed for that address in the first DRAM 302, which corresponds to the address at which the guarantee bit data is stored, and its contents were rewritten.

Based on the above described facts, the guarantee bit comparing/generating circuit 304 and the data selector 305 perform the control operations to be described below in the first control state.

That is, when the CPU, which is not shown in FIG. 3, outputs the address data for accessing the first DRAM 302 to the address bus 306, and specifies the read operation by making the write enable signal 308 inactive, the address data is input from the address bus 306 to the first DRAM 302. As a result, the data is read from the address in the first DRAM 302, which corresponds to the address data. This read data is input to the data selector 305.

Simultaneously, the address data is input also to the second DRAM 303, so that the guarantee bit data is read from the address in the second DRAM 303, which corresponds to the address data, to the guarantee bit comparing/generating circuit 304.

In the first control state, the guarantee bit comparing/generating circuit 304 determines whether or not the lowest two bits ("b1" and "b0") of the read guarantee bit data are "01" when the write enable signal 308 is inactive.

If the lowest two bits of the read guarantee data are "01", the guarantee bit comparing/generating circuit 304 makes the data selector 305 select the data read from the first DRAM 302, and output the selected data to the data bus 307.

If the lowest two bits of the read guarantee data are not "01", the guarantee bit comparing/generating circuit 304 makes the data selector 305 output the fixed value "0" to the data bus 307 as read data.

In this way, the fixed value "0" is always output from the address in the first DRAM 302, whose content is not rewritten, without performing the initialization process for the first DRAM 302. As a result, a virtual memory clear operation can be implemented.

Provided next is the explanation about an example in which the memory element shown in FIG. 3 is an image memory to be used for image processing, etc.

Assuming that the entire contents of the first DRAM 302 are cleared (screen clear) after a read process such as screen scanning, etc. is performed for all of the addresses in the first DRAM 302 in the above described first control state, the CPU, which is not shown in FIG. 3, sets the following second control state for the guarantee bit comparing/generating circuit 304.

When the CPU, which is not shown in FIG. 3, outputs the address data for accessing the first DRAM 302 and the write data to the address bus 306 and the data bus 307, and specifies the write operation by making the write enable signal 308 active, the address data is input also to the second DRAM 303. As a result, the address in the second DRAM 303, which corresponds to the address data, is specified.

The guarantee bit comparing/generating circuit 304 writes the set data "n1n" appearing as the left row of FIG. 4D to the above described address in the second DRAM 303 when the write enable signal 308 is active in the second control state. As a result, the value of the bit "b1" in the guarantee bit data stored at the above described address in the second DRAM 303 is changed to "1", which is stored at the address in the second DRAM 303. The values of the bits "b2" and "b0" are left unchanged.

Here, after a read process such as screen scanning, etc. is performed for all of the addresses in the first DRAM 302, the entire contents of the guarantee bit data stored at all of the addresses in the second DRAM 303 are either of the states "100" and "101", as shown in FIG. 4C.

As shown in FIG. 4E(1), in the case of the contents of the guarantee bit data at a desired address in the second DRAM 303 is the initial state "100" immediately after the contents are changed from the first control state due to the guarantee bit data control operation when the write operation is performed in the second control state, if the write operation is performed for that address, the values of the guarantee bit data are changed to "110".

Furthermore, as shown in FIG. 4E(2), in the case of the contents of the guarantee bit data at the desired address in the second DRAM 303 is the initial value state "101" immediately after the contents changed from the first control state, if the write operation is performed for that address, the values of the guarantee bit data are changed to "111".

Still further, as shown in FIG. 4E(3), in the case of the contents of the guarantee bit data at the desired address in the second DRAM 303 is "110" after only the write operation is performed following the change of the contents to the second control state (in FIGS. 4E(1) and 4E(3)), if the write operation is performed for that address, the values of the guarantee bit data are left unchanged.

Still further, as shown in FIG. 4E(4), in the case of the contents of the guarantee bit data at the desired address in the second DRAM 303 is "111" after the write operation is performed following the change of the contents to the second control state (in FIGS. 4E(2) and 4E(4)), if the write operation is performed for that address, the values of the guarantee bit data are left unchanged.

Still further, as shown in FIG. 4E(5), in the case of the contents of the guarantee bit data stored at the desired address in the second DRAM 303 is "000" after only the read operation is performed following the change of the contents to the second control state (in FIGS. 4F(1), 4F(2), and 4F(3) to be described later), if the write operation is performed for that address, the values of the guarantee bit data are changed to "010".

Still further, as shown in FIG. 4E(6), in the case of the contents of the guarantee bit data stored at the desired address in the second DRAM 303 is "010" after only the write and read operations are performed (in FIGS. 4E(5), 4E(6), 4F(4), 4F(5), and 4F(6)), if the write operation is performed for that address, the values of the guarantee bit data are left unchanged.

If the CPU, which is not shown in FIG. 3, outputs the address data for accessing the first DRAM 302 to the address bus 306 and specifies the read operation by making the write enable signal 308 inactive, the address data is input also to the second DRAM 303. As a result, the address in the second DRAM 303 corresponding to the address data is specified. The guarantee bit comparing/generating circuit 304 writes the set data "0n0" appearing as the right row of FIG. 4D to the above described address in the second DRAM 303 if the write enable signal 308 is active, in the second control state. As a result, the values of the bits "b2" and "b0" of the guarantee bit data stored at the address in the second DRAM 303 are changed to "0". The value of the bit "b1" is left unchanged.

With the above described guarantee bit data control operations when the read operation is performed in the second control state, as shown in FIG. 4F(1), in the case of the contents of the guarantee bit data at a desired address in the second DRAM 303 is the initial state "100" immediately after the contents are changed to the first control state, if the read operation is performed for that address, the values of the guarantee bit data are changed to "000".

Furthermore, as shown in FIG. 4F(2), in the case of the contents of the guarantee bit data at the desired address in the second DRAM 303 is the initial value state "101" immediately after the contents is changed from the first control state, if the read operation is performed for that address, the values of the guarantee bit data are also changed to "000".

Still further, as shown in FIG. 4F(3), in the case of the contents of the guarantee bit data at the desired address in the second DRAM 303 is "000" after only the read operation is performed following the change of the contents to the second control state (FIGS. 4F(1), 4F(2), and 4F(3)), if the read operation is performed for that address, the values of the guarantee bit data are left unchanged.

Still further, as shown in FIG. 4F(4), in the case of the contents of the guarantee bit data at the desired address in the second DRAM 303 is "110" after only the write operation is performed following the change of the contents to the second control state (in FIGS. 4E(1) and 4E(3)), if the write operation is performed for that address, the values of the guarantee-bit data are changed to "010".

Still further, as shown in FIG. 4F(5), in the case of the contents of the guarantee bit data at the desired address in the second DRAM 303 is "111" after only the write operation is performed following the change of the contents to the second control state (in FIGS. 4E(2) and 4E(4)), if the write operation is performed for that address, the values of the guarantee bit data are changed to "010".

Still further, as shown in FIG. 4F(6), in the case of the contents of the guarantee bit data at the desired address in the second DRAM 303 is "010" after the read and write operations are performed (in FIGS. 4E(5), 4E(6), 4F(4), 4F(5), and 4F(6)), if the write operation is performed for that address, the values of the guarantee bit data are left unchanged.

As is known from the above described details of the guarantee bit data operations when the write and read operations are performed in the second control state, if normal data is written to a desired address in the first DRAM 302, the bit "b1" of the guarantee bit data stored at the address in the second DRAM 303, which corresponds to the desired address, is always changed to "1" as shown in FIGS. 4E through 4E(6) and 4F(4) through 4F(6). Conversely, if the value of the bit "b1" of the guarantee bit data is "1", it proves that the write operation was certainly performed for the address in the first DRAM 302, which corresponds to the address at which the guarantee bit data is stored, and its contents were rewritten.

Based on the above described facts, the guarantee bit comparing/generating circuit 304 and the data selector 305 perform the control operations to be described below in the second control state.

Namely, if the CPU, which is not shown in FIG. 3, outputs the address data for accessing the first DRAM 302 to the address bus 306 and specifies the read operation by making the write enable signal 308 inactive, the address data is input from the address bus 306 to the first DRAM 302. As a result, the data is read from the address in the first DRAM 302, which corresponds to the address data. This read data is input to the data selector 305.

Simultaneously, the address data is input also to the second DRAM 303, so that the guarantee bit data is read from the address in the second DRAM, which corresponds to the address data, to the guarantee bit comparing/generating circuit 304.

In the second control state, the guarantee bit comparing/generating circuit 304 determines whether or not the value of the bit "b1" of the read guarantee bit data is "1" when the write enable signal 308 is inactive.

If the value of the bit "b1" of the read guarantee bit data is "1", the guarantee bit comparing/generating circuit 304 makes the data selector 305 select the data read from the first DRAM 302, and output the selected data to the data bus 307. If the value of the bit "b1" of the read guarantee bit data is not "1", the guarantee bit comparing/generating circuit 304 makes the data selector 305 output the fixed value "0" to the data bus 307 as the read data.

In this way, for example, after the read process such as a screen scanning process, etc. is performed for all of the addresses in the first DRAM 302 in the first control state, the CPU, which is not shown in FIG. 3, sets the second control state for the guarantee bit comparing/generating circuit 304, so that the entire contents of the first DRAM 302 can be virtually and instantaneously cleared without performing the memory clear process for the first DRAM 302.

For example, if the read process such as a screen scanning process, etc. is performed for all of the addresses in the first DRAM 302 in the above described second control state and the whole of the stored contents of the first DRAM 302 is again cleared (screen clear), the CPU, which is not shown in FIG. 3, again switches the control state of the guarantee bit comparing/generating circuit 304 from the second control state to the first control state.

Immediately after this switching operation, if the CPU, which is not shown in FIG. 3, outputs the address data for accessing the first DRAM 302 to the address bus 306 and specifies the read operation by making the write enable signal inactive, the address data is input from the address bus 306 to the first DRAM 302. As a result, the data is read from the address in the first DRAM 302, which corresponds to the address data. This read data is input to the data selector 305. Simultaneously, the address data is input also to the second DRAM 303, so that the guarantee bit data is read from the address in the second DRAM 303, which corresponds to the address data, to the guarantee bit comparing/generating circuit 304. This guarantee bit data is "010", which is the initial state after the contents of the guarantee bit data are changed from the second control state.

As described above, the guarantee bit comparing/generating circuit 304 determines whether or not the lowest two bits ("b1" and "b0") of the read guarantee bit data are "01" when the write enable signal 308 is inactive, in the first control state.

As a result, the lowest two bits are not "01" in the initial state "010" of the guarantee bit data after its contents is changed from the second control state. Accordingly, the guarantee bit comparing/generating circuit 304 makes the data selector 305 output the fixed value "0" to the data bus 307 as the read data.

As described above, for example, after the read process such as the screen scanning process, etc. is performed for all of the addresses in the first DRAM 302 in the second control state, the CPU, which is not shown in FIG. 3, again sets the first control state for the guarantee bit comparing/generating circuit 304, so that the entire contents is virtually and instantaneously cleared without performing the memory clear process for the first DRAM 302.

Figure 6:
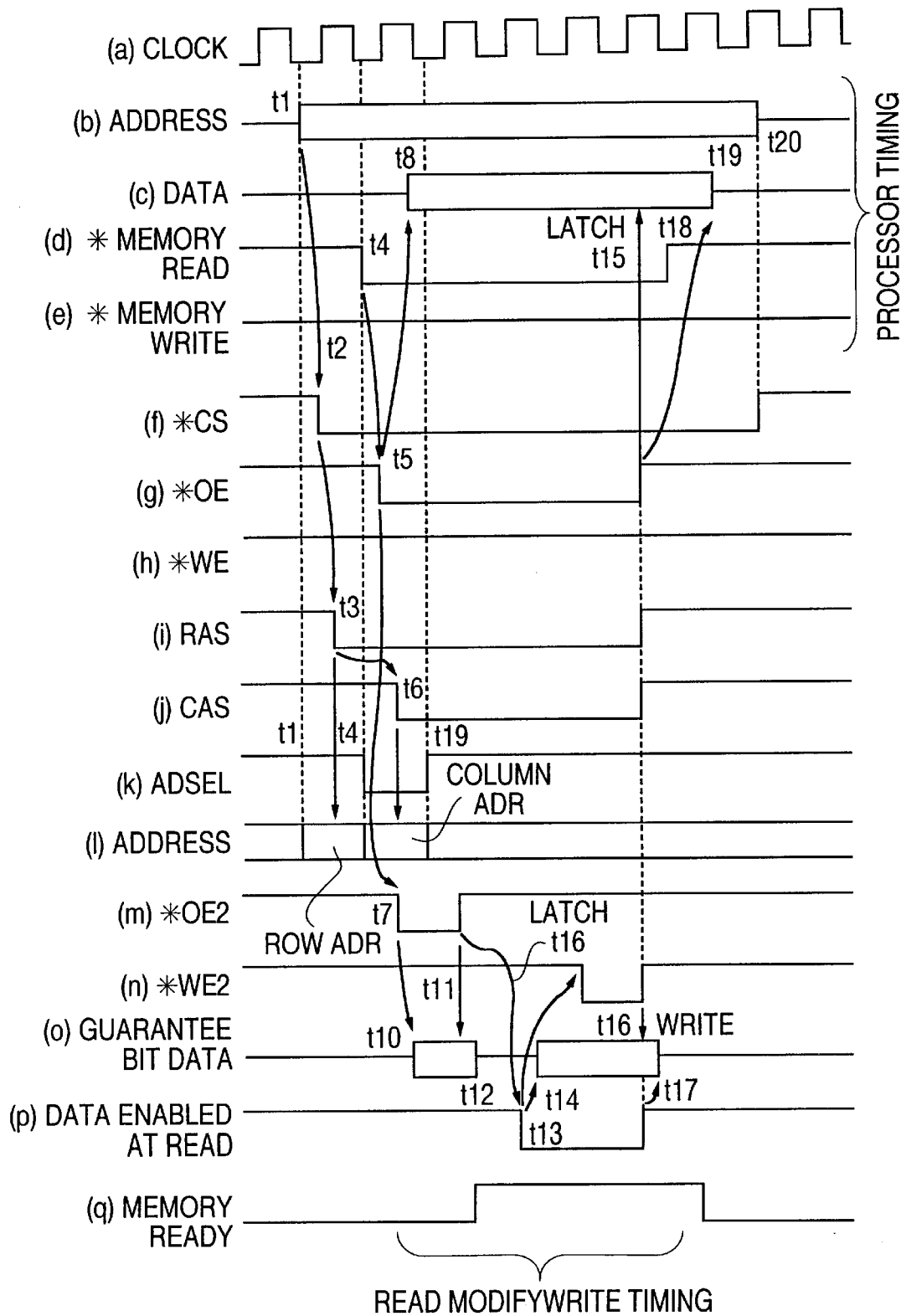
FIG. 6 shows an operation timing chart channel of the first preferred embodiment (when a read operation is performed)
Figure 7:
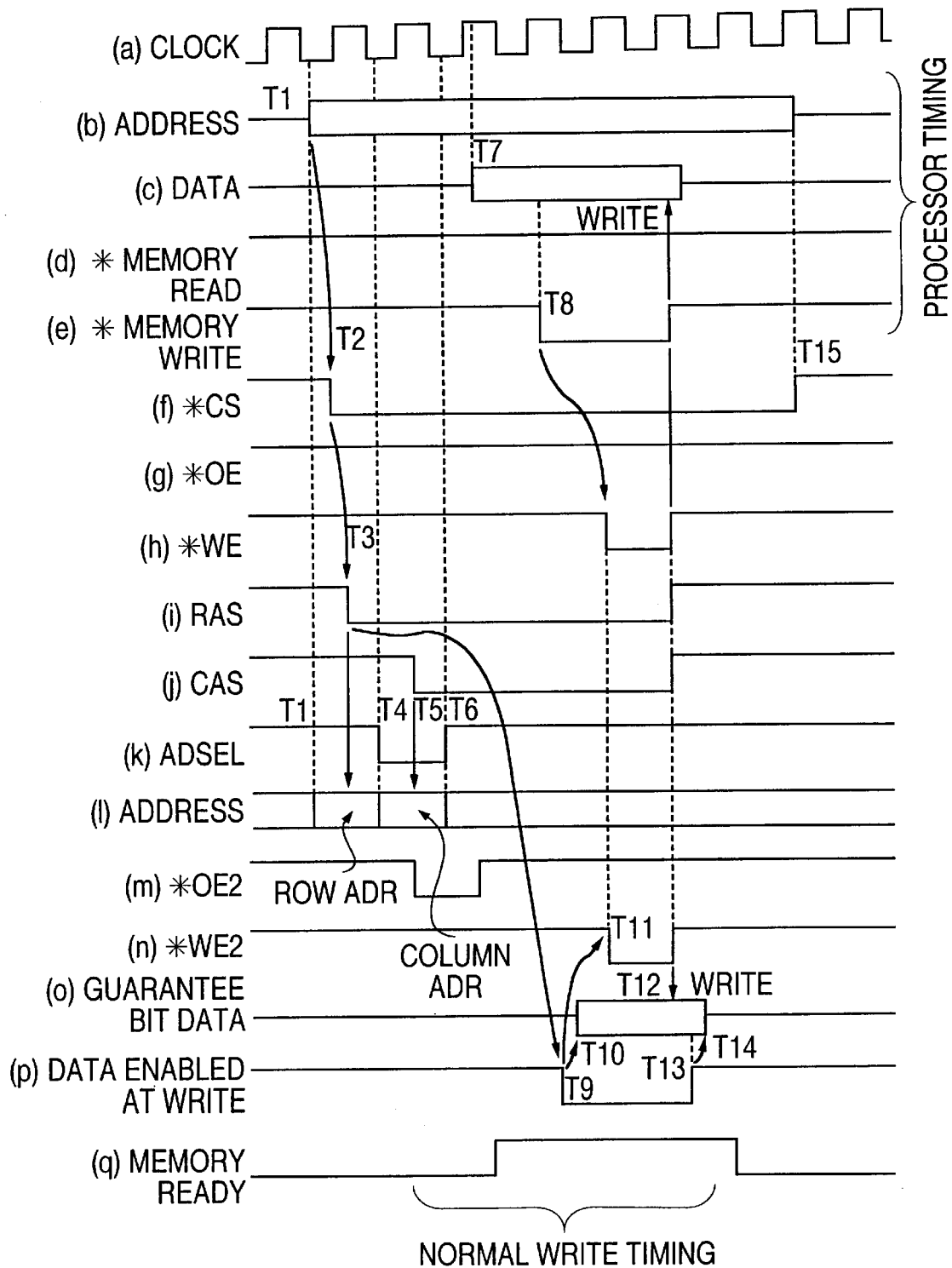
FIG. 7 shows an operation timing chart channel of the first preferred embodiment (when a write operation is performed)

Provided next is the explanation about a specific embodiment for implementing the capabilities according to the first embodiment of the present invention, by referring to the schematic diagram shown in FIG. 5 and the timing charts shown in FIGS. 6 and 7.

In FIGS. 5 through 7, all signals are active when they are low levels ("0"), while they are inactive when they are high levels ("1"). That is, all circuits operate according to negative logic.

In FIG. 5, a first DRAM 507 corresponds to the first DRAM 302 shown in FIG. 3, and stores normal data. The first DRAM 507 includes data respectively composed of a lower 8 bits and a higher 8 bits, and 1-bit parity bits which respectively correspond to the lower and higher 8 bits (1 bit×2).

In FIG. 5, a second DRAM 508 corresponds to the second DRAM 303 shown in FIG. 3, and stores guarantee bit data. The second DRAM 303 includes 3-bit guarantee bit data (3 bits×2) which respectively correspond to the lower and higher 8-bit data. Accordingly, the memory clear process can be performed respectively for the data composed of lower 8 bits and upper 8 bits in this configuration.

Additionally, in FIG. 5, a selector 513 and a latch 515 correspond to the data selector 305 shown in FIG. 3.

Furthermore, in FIG. 5, a read modify write timing generating circuit 509, a latch 516, bit masking circuits 517 and 518, a bit comparing circuit 519, a comparison data register 520, a comparison bit register 521, a data-at-write register 522, a data-at-read register 523, and an OR circuit 528 correspond to the guarantee bit comparing/generating circuit 304 shown in FIG. 3.

Detailed Operations Performed in the First Preferred Embodiment When a Read Operation is Performed An input gate 501 is provided with an enable signal EN which is always active (low level: 0 volt). A Clock signal CLK (Clock shown in FIGS. 6(*a*) and 7(*a*)) from a clock generating circuit, which is not shown in FIG. 5, a Memory Read signal RD from a CPU, which is not shown in FIG. 5, (Memory Read: FIGS. 6(*d*) and 7(*d*)), and a Memory Write signal WR (Memory Write: FIGS. 6(*e*) and 7(*e*)) are always input to the input gate 501.

The timing generating circuit 506 and the read modify write timing generating circuit 509 operate in synchronization with the Clock signal CLK input via the input gate 501.

When the CPU, not shown in FIG. 5, executes the read instruction, address data is first output to an address bus 524 (at "t1" of FIG. 6(*b*)).

The input gate 502 is provided with the enable signal EN which is always active. The address data on the address bus 524 is always input to the input gate 502.

An address decoder 510 (address DEC) arranged on the output side of the input gate 502 decodes the address data output to the address bus 524. If the decoded address is for the memory device including the address decoder itself, the address decoder 510 makes a chip select signal CS output to the timing generating circuit 506 to be active (at "t2" of FIG. 6(*f*)).

When the chip select signal CS is made active, the timing generating circuit 506 makes an address select signal ADSEL provided to the selector 512 to be active for one clock cycle, in synchronization with the first high-to-low transition of the Clock signal CLK input via the input gate 501. As a result, the address select signal ADSEL is made inactive for the first one clock cycle from when an address is output to the address bus 524 (from "t1" to "t4" in FIG. 6(*k*)), so that the selector 512 selects the row address data (row ADR) composed of the upper 9 bits of the address data input from the address bus 524 via the input gate 502 and a selector 511, to be described later, and outputs the selected row address data to the first DRAM 507 (refer to FIG. 6(*l*)). Additionally, the address select signal ADSEL is made active for the next one clock cycle from when the address is output to the address bus 524 (from "t4" to "t9" in FIG. 6(*k*)), so that the selector 512 selects the column address data (column ADR) composed of the lower 9 bits of the address data, and outputs the selected column data to the first DRAM 507 (refer to FIG. 6(*l*)).

In parallel with the above described operations, after the chip select signal CS is made active, the timing generating circuit 506 makes a row address signal RAS active (at "t3" of FIG. 6(*i*)) in synchronization with the first low-to-high transition of the Clock signal CLK, and makes a column address signal CAS active in synchronization with the next low-to-high transition of the Clock signal CLK (at "t6" of FIG. 6(*j*)).

As a result, the first DRAM 507 captures the row address data output from the selector 512 when the row address signal RAS is made active (at "t3" of FIG. 6(*i*)), and captures the column address data (FIG. 6(*l*) output from the selector 512 when the column address signal CAS is made active (at "t6" of FIG. 6(*j*)).

After the address data is output to the address bus 524 (at "t1" of FIG. 6(*b*)), the Memory Read signal RD input to the timing generating circuit 506 input from the CPU, not shown in FIG. 5, via the input gate 501 is made active (at "t4" of FIG. 6(*d*)).

When the Memory Read signal RD is made active, the timing generating circuit 506 makes an output enable signal OE active (at "t5" of FIG. 6(*g*)). As a result, the first DRAM 507 reads the normal data from the address corresponding to the row address data and the column address data (FIG. 6(*l*) input from the timing "t1" to "t9" (at "t8" of FIG. 6(*c*)).

The normal data read from the first DRAM 507 is latched by the latch 515 when the output enable signal OE output from the timing generating circuit 506 is made inactive (at "t16" of FIG. 6(*g*)).

After the output enable signal OE output from the timing generating circuit 506 is made inactive, the first DRAM suspends the output of the normal data (at "t19" of FIG. 6(*c*)). Furthermore, after the Memory Read signal RD input from the CPU, which is not shown in FIG. 5, to the timing generating circuit 506 via the input gate 501 is made inactive (at "t18" of FIG. 6(*d*)), the chip select signal CS output from the address decoder 510 to the timing generating circuit 506 is made inactive when the output of the address data from the CPU to the address bus 524 is suspended (at "t20" of FIG. 6(*b*)). The read operations that the CPU performs for the first DRAM 507 are completed.

In parallel with the read operations for the first DRAM 507, the guarantee bit data control operations for the second DRAM 508, which particularly relate to the present invention, are performed.

In a similar manner as in the case of the first DRAM 507, the second DRAM 508 first captures the row address data (FIG. 6(*l*)) output from the selector 512 when the row address signal RAS output from the timing generating circuit 506 is made active (at "t3" of FIG. 6(*i*)), and captures the column address data (FIG. 6(*l*)) output from the selector 512 when the column address signal CAS is made active (at "t6" of FIG. 6(*j*)).

Additionally, the read modify write timing generating circuit 509 makes an output enable signal OE2 active for only one clock cycle when the output enable signal OE output from the timing generating circuit 506 is made active (from "t7" to "t11" in FIG. 6(*m*)). In synchronization with this operation, the second DRAM 508 reads the guarantee bit data from the address corresponding to the row address data and the column address data (FIG. 6(*l*)) input from the timing "t1" to "t9" (from "t10" to "t12" in FIG. 6(*o*)).

The guarantee bit data read from the second DRAM 508 is latched by the latch 516 under the control of the read modify write timing generating circuit 509, when the output enable signal OE2 output from the read modify write timing generating circuit 509 is made inactive ("t11" of FIG. 6(*m*)).

The output enable signal OE2 output from the read modify write timing generating circuit 509 to the second DRAM 508 is made inactive (at "t11" of FIG. 6(*m*)), and the output of the guarantee bit data from the second DRAM is suspended (at "t12" of FIG. 6(*o*)).

Here, a Memory Ready signal RDY is output from the timing generating circuit 506 at the timing shown in FIG. 6(*q*). This Memory Ready signal RDY is output to the CPU, which is not shown in FIG. 5, via the output gate 504 enabled by the chip select signal CS which is active.

After the guarantee bit data is latched by the latch 516, the bit comparing circuit 519 performs a bit comparing operation. The bit comparing circuit 519 determines whether or not the lowest two bits of the guarantee bit data latched by the latch 516 are "01" in the above described first control state, and determines whether or not the bit "b1" of the guarantee bit data latched by the latch 516 is "1" in the second control state.

To implement these determination, the following operations are performed.

First of all, the CPU, which is not shown in FIG. 5, assigns the comparison data "*01" to the comparison data register 520 via the data bus 525 in the first control state, and assigns the comparison data "*1*" to the comparison data register 520 via the data bus 525. Note that "*" indicates an indefinite value.

The CPU, which is not shown in FIG. 5, makes an I/O Write signal active (low level), makes a DMA enable signal inactive (high level), and makes an output of the OR circuit 528 active (low level), so that the operations for assigning each comparison data to the comparison data register 520 are implemented as the operations for transferring the required comparison data via the data bus 525.

Additionally, the CPU, not shown in FIG. 5, assigns the bit mask data "011" to the comparison bit register 521 via the data bus 525 in the first control state, and assigns the bit mask data "010" to the comparison bit register 521 via the data bus 525 in the second control state.

The CPU, which is not shown in FIG. 5, makes the I/O Write signal active, makes the DMA enable signal inactive, and makes the output of the OR circuit 528 active, so that the above described operations for assigning each bit mask data to the comparison bit register 521 are implemented as the operations for transferring required bit mask data via the data bus 525, in a similar manner as in the case of the comparison data register 520.

The bit masking circuit 517 performs a bitwise AND operation between the guarantee bit data latched by the latch 516 and the bit mask data assigned to the comparison bit register 521. As a result, data "0xy" is output from the bit masking circuit 517 to the bit comparing circuit 519 in the first control state, and data "0x0" is input in the second control state. Here, the bit value "x" is the value of the bit "b1" of the guarantee bit data latched by the latch 516, while the bit value "y" is the value of the bit "b0" of the guarantee bit data latched by the latch 516.

In the meantime, the bit masking circuit 518 performs a bitwise AND operation between the comparison data assigned to the comparison data register 520 and the bit mask data assigned to the comparison bit register 521. As a result, the data "001" is input from the bit masking circuit 518 to the bit comparison circuit 519 in the first control state, while the data "010" is input in the second control state.

The bit comparing circuit 519 performs a bitwise exclusive OR between the 3-bit data input from the bit masking circuit 517 and the 3-bit data input from the bit masking circuit 518, and further performs a NOR operation by using the result of the operation on each bit as an input.

That is, in the first control state, the bit comparing circuit 519 performs a bitwise exclusive OR operation between the 3-bit data "0xy" input from the bit masking circuit 517 and the 3-bit data "001" input from the bit masking circuit 518. The operation on the bit "b2" (most significant bit) always results in "0". Additionally, both of the operations on the bits "b1" and "b0" (least significant bit) result in "0" when the bit values "x" and "y" are respectively "0" and "1". Accordingly, the NOR operation, which is performed by using the result of the operation on each of the bits, results in "1" only in this case.

In the second control state, the bit comparing circuit 519 performs a bitwise exclusive OR operation between the 3-bit data "0x0" input from the bit masking circuit 517 and the 3-bit data "010" input from the bit masking circuit 518. Both of the operations on the bit "b2" (most significant bit) and the bit "b0" (least significant bit) always result in "0". Additionally, the operation on the bit "b1" results in "0" when the bit value "x" is "1". Accordingly, the NOR operation performed by using the result of the operation on each bit as an input results in "1".

As described above, the bit comparing circuit 519 determines whether or not the lowest two bits of the guarantee bit data read from the second DRAM 508 to the latch 516 are "01" in the first control state, while it determines whether or not the bit "b1" of the guarantee bit data read from the second DRAM 508 to the latch 516 is "1" in the second control state.

If the result of the operation performed by the bit comparing circuit 519 is "1", the selector 513 selects the data which is read from the first DRAM 507 and which is latched by the latch 515. If the result of the operation performed by the bit comparing circuit 519 is "0", the selector 513 selects the fixed value "0" and outputs this selected value to the data bus 525 via the output gate 505. When the chip select signal CS output from the address decoder 510 is active (low level) and the Memory Read signal RD input via the input gate 501 is active (low level), the output of the OR circuit 526 is made active (low level), so that the output gate 505 is enabled.

In this way, the fixed value "0" is always output from an address in the first DRAM 302, whose content is not rewritten, without performing an initialization process for the first DRAM 302, thereby implementing a virtual memory clear operation.

Then, after the read modify write timing generating circuit 509 makes the output enable signal OE2 inactive (at "t11" of FIG. 6(*m*)), it makes a data-at-read enable signal be provided to the data-at-read register 523 active, for example, for only two clock cycles (from "t13" to "t17" in FIG. 6(*p*)) after one clock cycle elapses.

As a result, the set data at the time of the read operation (each set data appearing in the right columns of FIG. 4A or 4D) is input from the data-at-read register 523 to the second DRAM 508 (at and after "t14" in FIG. 6(*o*)).

Then the read modify write timing generating circuit 509 makes the data-at-read enable signal active (at "t13" of FIG. 6(*p*)), and makes the write enable signal WE2 active, for example, for only one clock cycle (from "t15" to "t16" in FIG. 6(*n*)), after one clock cycle elapses.

The second DRAM 508 writes the guarantee bit data input from the data-at-read register 523 to the address corresponding to the row address data and the column address data (FIG. 6(*l*)), which are input from the timing "t1" to "t9", when the write enable signal WE2 is again made inactive (at "t16" of FIG. 6(*n*)).

After the read data enable signal output from the read modify write timing generating circuit 509 is made inactive, the read data register 523 suspends an output of the guarantee bit data (at "t17" of FIG. 6(*o*)).

As a result, the change process for the guarantee bit data at the time of the read operation, which is shown in FIG. 4C or 4F, is implemented.

When the CPU, which is not shown in FIG. 5, sets the above described first control state in the memory having the configuration shown in FIG. 5, it makes the I/O Write signal active (low level), makes the DMA enable signal inactive (high level), makes the output of the OR circuit 528 active (low level), and transfers the set data appearing in the right column of FIG. 4A to the data-at-read register 523 via the data bus 525.

Similarly, when the CPU, which is not shown in FIG. 5, sets the above described second control state in the memory, the CPU makes the I/O Write signal active, makes the DMA enable signal inactive, makes the output of the OR circuit 528 active, and transfers the set data appearing in the right column of FIG. 4D to the data-at-read register 523 via the data bus 525.

The timing generating circuit 506 makes the selector 511 select the address data input from the address bus 524 via the input gate 502 according to a control signal RAD when a normal memory access is made, although this does not particularly relate to the present invention. The timing generating circuit 506 outputs a refresh timing signal RTM to a refresh controller 514 at predetermined time intervals such as at 10-microseconds intervals, and makes the selector 511 select the address data output from the refresh controller 514 according to the control signal RAD. In this way, the refresh operations for the first DRAM 507 and the second DRAM 508 are performed.

Detailed Operations Performed in the First Preferred Embodiment When a Write Operation is Performed When the CPU, which is not shown in FIG. 5, executes a write instruction, address data is output to the address bus 524. Thereafter, the operations until the row address data and the column address data are specified for the first DRAM 507 and the second DRAM 508 are similar to those performed when the read operation is performed. In this case, the respective timing "T1" through "T4", "T5", and "T6" shown in FIG. 7 correspond to "t1" through "t4", "t6", and "t9" shown in FIG. 6.

Next, the CPU, which is not shown in FIG. 5, outputs write data which is normal data to the data bus 525 at the timing "T7" shown in FIG. 7(c). This write data is input via the input gate 503. When the chip select signal output from the address decoder 510 is active (low level) and the memory read signal RD input via the input gate 501 is inactive (high level), the output of the inverter 529 is made active (low level) and the output of the OR circuit 527 is made active (low level). As a result, the input gate 503 is enabled Furthermore, the memory write signal WR input from the CPU to the timing generating circuit 506 via the input gate 501 is made active (at "t8" of FIG. 7(e)).

The timing generating circuit 506 makes the write enable signal WE active for only one clock cycle, after one clock cycle elapses from when the Memory Write signal WR is made active (from "t11" to "t12" in FIG. 7(h)). As a result, the first DRAM 507 writes the normal data input from the data bus 525 to the address corresponding to the row address data and the column address data (FIG. 7(l)), which are input from the timing "T1" to "T6" when the write enable signal WE is again made inactive ("t12" of FIG. 7(h)).

After both of the memory write signal WR input from the CPU, which is not shown in FIG. 5, to the timing generating circuit 506 via the input gate 501 and the write enable signal WE output from the timing generating circuit 506 are made inactive, the chip select signal CS output from the address decoder 510 to the timing generating circuit 506 is made inactive when the output of the address data from the CPU to the address bus 524 is suspended. As a result, the write operation that the CPU performs for the first DRAM 507 is completed.

In parallel with the write operation performed for the first DRAM 507, the guarantee bit control operation for the second DRAM 508, which particularly relates to the present invention, is performed.

First of all, the second DRAM 508 captures the row address data (FIG. 7(l)) output from the selector 512 when the row address signal RAS output from the timing generating circuit 506 is made active (at "T3" of FIG. 7(i)), and then captures the column address data (FIG. 7(l)) output from the selector 512 when the column address signal CAS is made active (at "T6" of FIG. 7(j)), in a similar manner as in the case of the first DRAM 507.

After the row address signal RAS output from the timing generating circuit 506 is made active, the read modify write timing generating circuit 509 makes the data-at-write enable signal provided to the data-at-write register 522 active (from "T9" to "T13" in FIG. 7(p)), for example, for only two clock cycles from the timing "T9" of FIG. 7(p).

As a result, the set data at the time of the write operation (the above described set data appearing in the left columns of FIG. 4A or 4D) is input from the data-at-write register 522 to the second DRAM 508 (at and after "T10" of FIG. 7(o))

The read modify write timing generating circuit 509 makes the write enable signal WE2 active (from "T11" to "T12" in FIG. 7(n)) in perfect synchronization with the write enable signal WE output from the timing generating circuit 506.

The second DRAM 508 writes the guarantee bit data input from the data-at-write register 522 to the address corresponding to the row address data and the column address data (FIG. 7(l)) input from the timing "T1" to "T6", when the write enable signal WE2 is again made inactive (at "T12" of FIG. 7(n)).

After the data-at-write enable signal output from the read modify write timing generating circuit 509 is made inactive, the data-at-write register 522 suspends the output of the guarantee bit data (at "T14" of FIG. 7(o)).

As a result, the above described change process for the guarantee bit data at the time of the write operation, which is shown in FIG. 4B or 4E, is implemented.

When the CPU, which is not shown in FIG. 5, sets the above described first control state in the memory having the configuration shown in FIG. 5, it makes the I/O Write signal active (low level), makes the DMA enable signal inactive (high level), makes the output of the OR circuit 528 active (low level), and transfers the set data appearing in the left column of FIG. 4(a) to the data-at-write register 522 via the data bus 525.

Similarly, when the CPU, which is not shown in FIG. 5, sets the above described second control state in the memory having the configuration shown in FIG. 5, it makes the I/O Write signal active, makes the DMA enable signal inactive, makes the output of the OR circuit 528 active, and transfers the set data appearing in the left column of FIG. 4(d) to the data-at-write register 522 via the data bus 525.

Second Preferred Embodiment

Provided next is the explanation about the second preferred embodiment according to the present invention.

The principle of the second preferred embodiment according to the present invention is similar to that of the first preferred embodiment according to the present invention, which is shown in FIGS. 2 and 3.

However, there is a difference between the configuration according to the first preferred embodiment of the present invention and that according to the second preferred embodiment of the present invention. That is, the guarantee bit data stored in the second DRAM 508 shown in FIG. 3 is not the data explained by referring to FIG. 4, but is sum check data.

The CPU, which is not shown in FIG. 3, outputs the address data for accessing the first DRAM 302 and the write data which is normal data to the address bus 306 and the data bus 307, and at the same time, it specifies the write operation by making the write enable signal 308 active. Then, the address data is input from the address bus 306 to the first DRAM 302, and the write data is input to the first DRAM 302 via the data driver 301 (which operates when the write enable signal 308 is made active). As a result, the write data is written to the address in the first DRAM 302 corresponding to the address data.

Simultaneously, the address data is input also to the second DRAM 303, so that the address in the second DRAM 303, which corresponds to that address data, is specified.

The above described operations are similar to those performed in the first preferred embodiment of the present invention.

In the first control state, when the write enable signal 308 is active, the guarantee bit comparing/generating circuit 304 calculates sum check data on the basis of a predetermined radix corresponding to the first control state for the write data to be written to the first DRAM 302, and writes the sum check data to the above described address in the second DRAM 303 as the guarantee bit data.

As is known from the above described guarantee bit data control operations at the time of the write operation in the first control state, when normal data is written to a desired address in the first DRAM 302, the contents of the guarantee bit data stored at the address in the second DRAM 303, which corresponds to the desired address, indicate the correct result of the sum check operation on the basis of a predetermined radix, which corresponds to the normal data and the first control state. Conversely, if no normal data has been written to the desired address in the first DRAM 302, the contents of the guarantee bit data stored at the address in the second DRAM 303, which corresponds to the desired address, does not indicate the correct result of the sum check operation.

Based on the above described facts, the guarantee bit comparing/generating circuit 304 and the data selector 305 perform the control operations to be described below.

That is, if the CPU, not shown in FIG. 3, outputs the address data for accessing the first DRAM 302 to the address bus 306 and specifies the read operation by making the write enable signal 308 inactive, the address data is input from the address bus 306 to the first DRAM 302. As a result, the data is read from the address in the first DRAM 302, which corresponds to the address data. This read data is input to the data selector 305.

Simultaneously, the address data is input also to the second DRAM 303, so that the guarantee bit data is read from the address in the second DRAM 303, which corresponds to the address data, to the guarantee bit comparing/generating circuit 304.

In the first control state, the guarantee bit comparing/generating circuit 304 performs the sum check operation for the read data output from the first DRAM 302 and makes a comparison between the result of the operation and the guarantee bit data read from the second DRAM 303, when the write enable signal 308 is inactive.

If the result of the sum check operation matches the guarantee bit data read from the second DRAM 303, the guarantee bit comparing/generating circuit 304 makes the data selector 305 select the data read from the first DRAM 302 and output the selected data to the data bus 307.

Conversely, if the result of the sum check operation does not match the guarantee bit data output from the second DRAM 303, the guarantee bit comparing/generating circuit 304 makes the data selector 305 output the fixed value "0" to the data bus 307 as the read data.

In this way, the fixed value "0" is always output from an address of the first DRAM 302, whose contents are not rewritten, without performing an initialization process for the first DRAM 302. As a result, a virtual memory clear operation can be implemented.

To clear the entire contents of a memory in the first control state, the CPU, which is not shown in FIG. 3, assigns a predetermined radix corresponding to the second control state, which is different from the predetermined radix corresponding to the first control state, to the guarantee bit comparing/generating circuit 304 as the radix used for the sum check operation.

As a result, when normal data is read from each address in the first DRAM 302 immediately after switching the above described radix, the result of the sum check operation performed for the read data output from the first DRAM 302 does not match the guarantee bit data read from the second DRAM 303. Therefore, the fixed value "0" is output from the data selector 305 to the data bus 307 as the read data for all addresses.

As described above, the CPU, which is not shown in FIG. 3, sets the second control state in the guarantee bit comparing/generating circuit 304, for example, after image processing, etc. is performed for each stored content of the first DRAM 302 in the first control state, so that the entire contents can be virtually and instantaneously cleared without performing a memory clear process for the first DRAM 302.

If the entire stored contents is again cleared, the CPU, which is not shown in FIG. 3, assigns a predetermined radix corresponding to the first control state to the guarantee bit comparing/generating circuit 304 as the radix to be used for the sum check operation.

Figure 8:
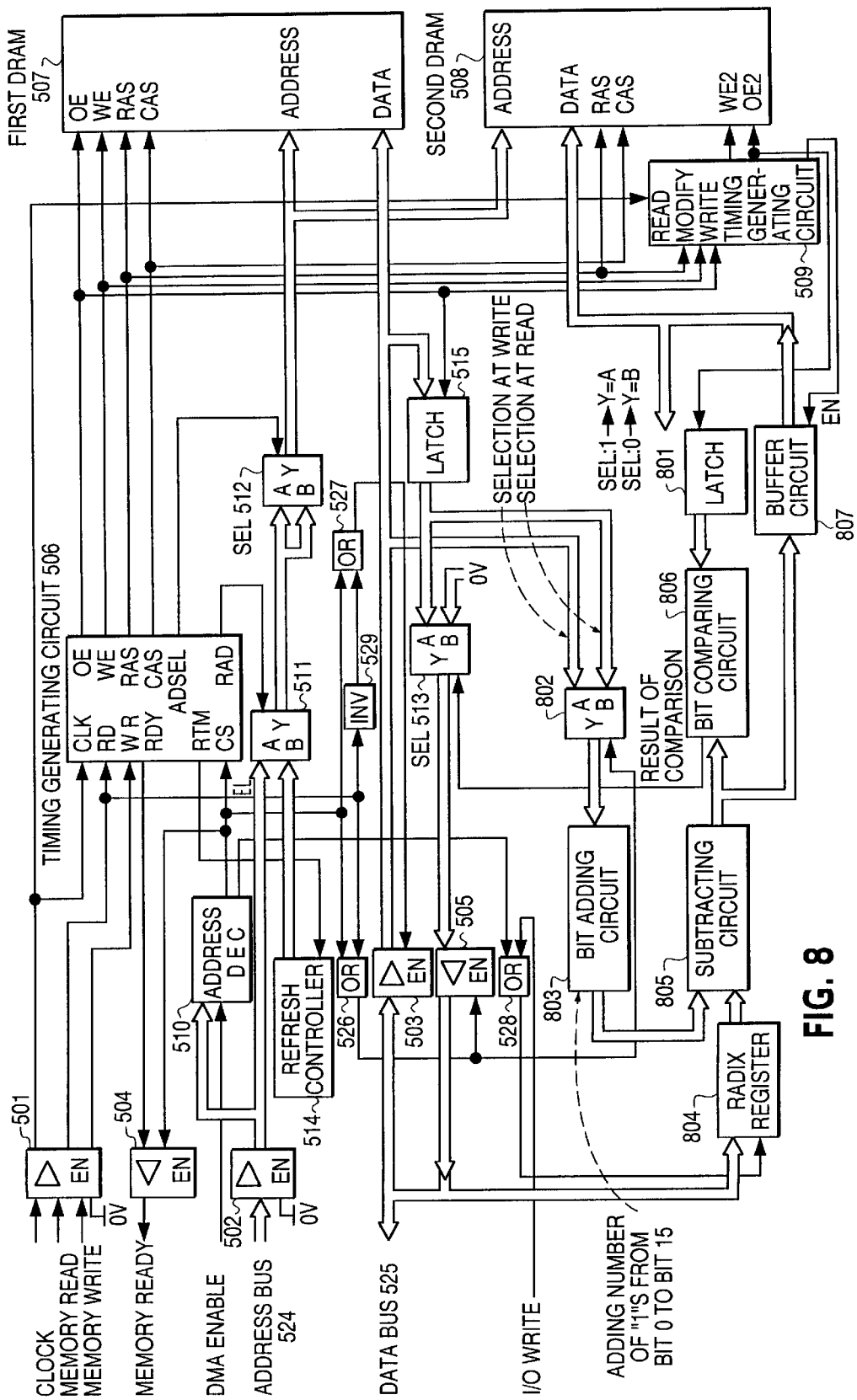
FIG. 8 is a schematic diagram showing the configuration of the second preferred embodiment.

Provided next is the explanation about a specific example for implementing the above described capabilities according to the second preferred embodiment of the present invention, by referring to the circuit configuration shown in FIG. 8.

Note that all the signals are active when they are low levels, and inactive when they are high levels in the explanation about FIG. 8. That is, all the circuits operate according to a negative logic.

Additionally, the portions denoted by the same reference numerals as those of FIG. 5 have the same capabilities as those according to the first preferred embodiment of the present invention.

Detailed Operations Performed in the Second Preferred Embodiment When a Read Operation is Performed In FIG. 8, the read control operation performed for the first DRAM 507 when the read operation is performed are exactly the same as those of FIG. 5 performed in the first preferred embodiment according to the present invention.

In parallel with the read operation performed for the first DRAM 507, the guarantee bit data control operation for the second DRAM 508, which particularly relates to the present invention, is performed.

First of all, the second DRAM 508 captures the row address data (refer to FIG. 6(*l*)) output from the selector 512 when the row address signal RAS output from the timing generating circuit 506 is made active (at "t3" of FIG. 6(*i*)), and captures the column address data (refer to FIG. 6(*l*)) output from the selector 512 when the column address signal CAS is made active (at "t6" of FIG. 6(*j*)).

The read modify write timing generating circuit 509 makes the output enable signal OE2 active only for one clock cycle, when the output enable signal OE output from the timing generating circuit 506 is made active (from "t7" to "t11" of FIG. 6(*m*)). In synchronization with this operation, the second DRAM 508 reads the guarantee bit data from the address corresponding to the row address data and the column address data (refer to FIG. 6(*l*)) input from the timing "t1" to "t9" (from "t10" to "t12" in FIG. 6(*o*)).

The guarantee bit data read from the second DRAM 508 is latched by the latch 801 under the control of the read modify write timing generating circuit 509 when the output enable signal OE2 output from the read modify write timing generating circuit 509 is made inactive (at "t11" of FIG. 6(*m*)).

When the read operation is performed, the chip select signal CS output from the address decoder 510 is made active (low level), the Memory Read signal RD input via the input gate 501 is made active (low level), and the output of the OR circuit 526 is made active (low level). As a result, the selector 802 selects the data which is read from the first DRAM 507 and latched by the latch 515.

Then, the bit adding circuit 803 adds the number of "1"s from the bit "b0" to the bit "b15" of the read data.

Next, the subtracting circuit 805 calculates the sum check data on the basis of the predetermined radix by subtracting the result of the addition output from the bit adding circuit 803 from the predetermined radix that the CPU, which is not shown in FIG. 8, assigns to the radix register 804 beforehand.

The bit comparing circuit 806 then determines whether or not the guarantee bit data latched by the latch 801 matches the sum check data output from the subtracting circuit 805. If "YES", the bit comparing circuit 806 outputs the result of the determination "1". If "NO", the bit comparing circuit 806 outputs the result of the determination "0".

If the result of the determination made by the bit comparing circuit 806 is "1", the selector 513 selects the data which is read from the first DRAM 507 and latched by the latch 515. If the result of the determination made by the bit comparing circuit 806 is "0", the selector 513 selects the fixed value "0", and outputs the selected data to the data bus 525 via the output gate 505.

As described above, the fixed value "0" is always output from an address in the first DRAM 507, whose content is not rewritten, without performing an initialization process for the first DRAM 507, thereby implementing a virtual memory clear operation.

Detailed Operations in the Second Preferred Embodiment When a Write Operation is Performed In FIG. 8, the write control operation performed for the first DRAM 507 at the time of the write operation is exactly the same as that of FIG. 5 performed in the first preferred embodiment according to the present invention.

In parallel with the write operation performed for the first DRAM 507, the guarantee bit control operation for the second DRAM 508, which particularly relate to the present invention, is performed.

When the write operation is performed, the chip select signal CS output from the address decoder 510 is made active (low level), and the Memory Read signal RD input via the input gate 501 is made inactive (high level). As a result, the output of the OR circuit 526 is made inactive (high level), and the selector 802 selects the write data input from the data bus 525 via the input gate 503.

The bit adding circuit 803 then adds the number of "1"s from the bit "b0" to the bit "b15" of the write data.

Next, the subtracting circuit 805 calculates the sum check data on the basis of the predetermined radix by subtracting the result of the addition output from the bit adding circuit 803 from the predetermined radix that the CPU, which is not shown in FIG. 8, assigns to the radix register 804 beforehand.

This sum check data is stored by the buffer circuit 807.

After the row address signal RAS output from the timing generating circuit 506 is made active, the read modify write timing generating circuit 509 makes the data (data-at-write?) enable signal provided to the buffer circuit 807 active (from "T9" to "T13" in FIG. 7(*p*)).

Consequently, the sum check data corresponding to the write data to the first DRAM 507 is input from the buffer circuit 807 to the second DRAM 508 as the guarantee bit data.

The read modify write timing generating circuit 509 makes the write enable signal WE2 active by perfectly synchronizing with the write enable signal WE output from the timing generating circuit 506 (from "T11" to "T12" in FIG. 7(*n*)).

When the write enable signal WE2 is again made inactive (at "T12" of FIG. 7(*n*)), the second DRAM 508 writes the guarantee bit data input from the buffer circuit 807 to the address corresponding to the row address data and the column address data (refer to FIG. 7(*l*)), which were previously input.

When the CPU, which is not shown in FIG. 8, sets the above described first control state in a memory having the configuration shown in FIG. 8, it makes the I/O Write signal active (low level), makes the DMA enable signal inactive (high level), and makes the output of the OR circuit 528 active (low level). As a result, the predetermined radix corresponding to the first control state is transferred to the radix register 804 via the data bus 525.

Similarly, when the CPU, which is not shown in FIG. 8, sets the above described second control state in the memory, it makes the I/O Write signal active, makes the DMA enable signal inactive, and makes the output of the OR circuit 528 active. As a result, the predetermined radix corresponding to the second control state is transferred to the radix register 804 via the data bus 525.

In the above described configuration, some redundant bits may be assigned to the radix register 804, second DRAM 508, and the bit comparing circuit 806, so that the data read from the first DRAM 507 is not selected after power is turned on, even if the result of the sum check operation for comparing with the read data output from the second DRAM 508 is all "0" or all "1". The bit data in which either "1"s or "0"s exist is assigned as the redundant bits when the radix is assigned, so that the comparison operation by the bit comparing circuit 806 or the setting operation for the second DRAM 508 (only at the time of the write operation) is performed in the state in which no operations are performed.

In this way, a memory clear operation can be performed by only rewriting the radix after power is turned on or a software process is performed.

Third Preferred Embodiment

Provided next is the explanation about the third preferred embodiment according to the present invention.

Figure 9:
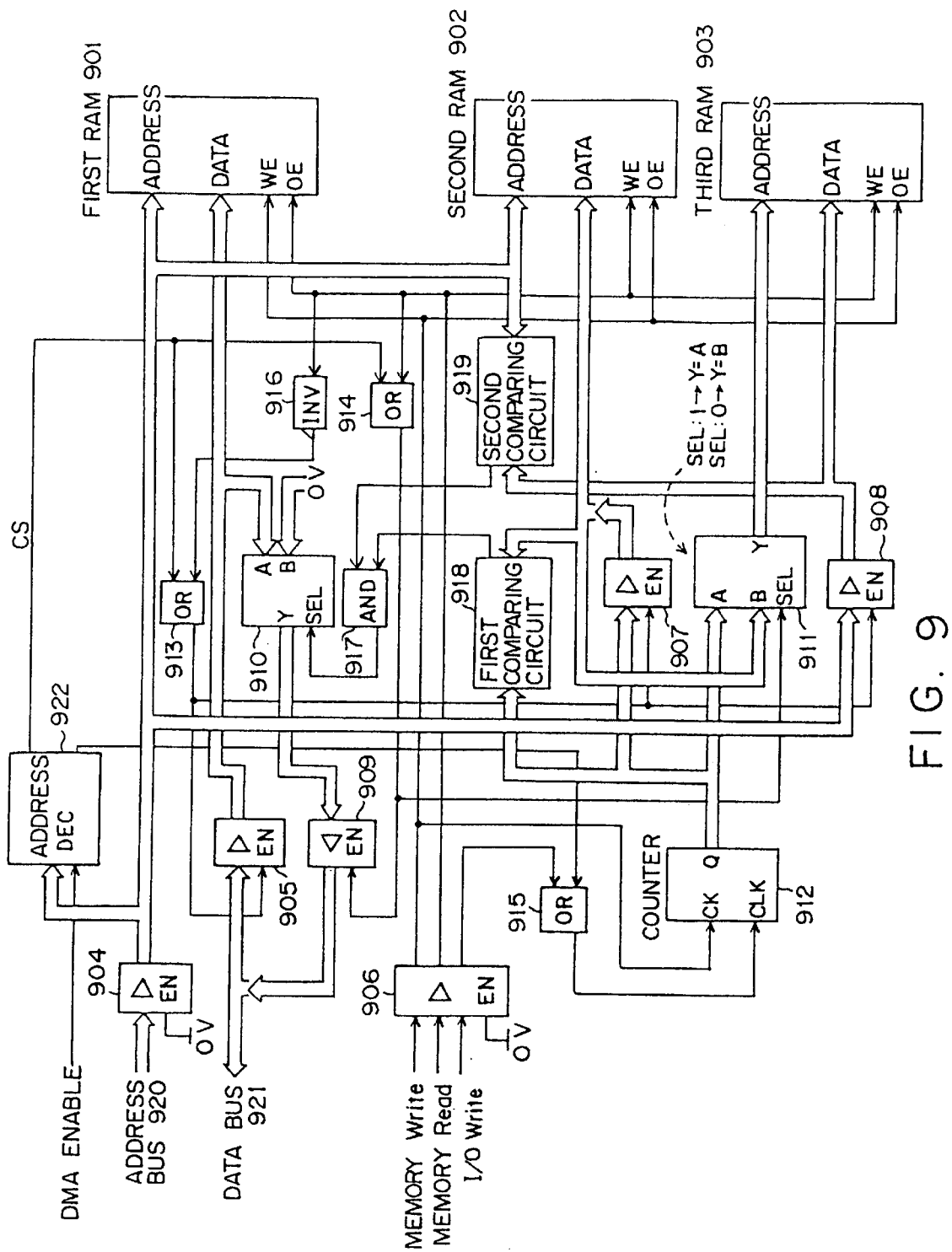
FIG. 9 is a schematic diagram showing the configuration of a third preferred embodiment.

FIG. 9 is a schematic diagram showing the specific example for implementing the capabilities of the third preferred embodiment according to the present invention.

In the explanation about FIG. 9, all the signals are active when they are low levels, and inactive when they are high levels. That is, all the circuits operate according to negative logic.

According to the third preferred embodiment of the present invention, a first RAM 901 stores normal data, and guarantee bit data of different types are stored in a second RAM 902 and a third RAM 903. In this case, each address in the first RAM 901 corresponds to each address in the second RAM 902. Each address in the third RAM 903 corresponds to each counter value that a counter 912 outputs.

The feature of the third preferred embodiment according to the present invention is that the first RAM 901, the second RAM 902, and the third RAM 903 are not limited to DRAMs. Accordingly, the mechanisms for providing an address signal or other control signals are simplified and represented by the configuration shown in FIG. 9.

Figure 10:
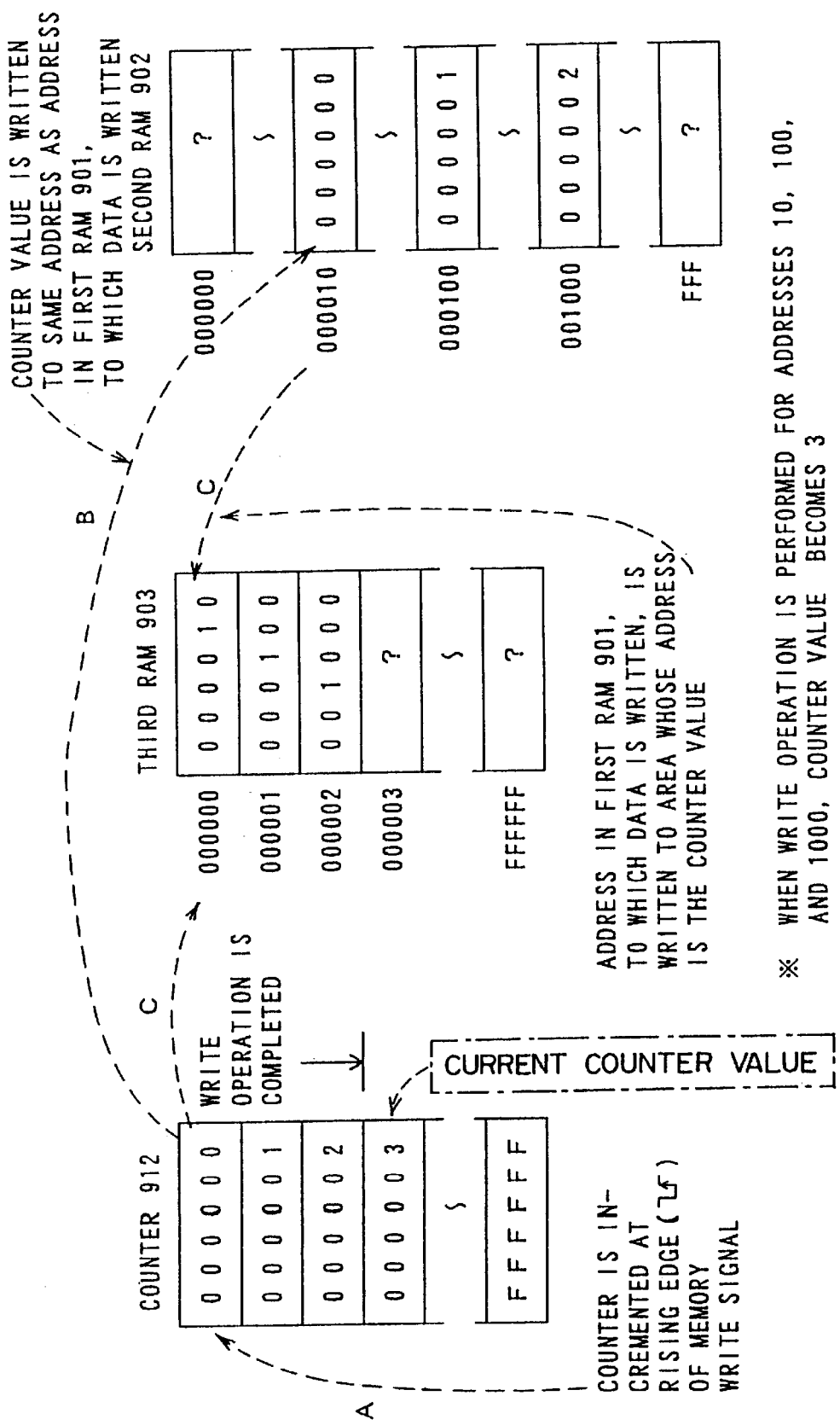
FIG. 10 is a schematic diagram explaining the operations performed in the third preferred embodiment (when a write operation is performed)

Detailed Operations Performed in the Third Preferred Embodiment When a Write Operation is Performed A CPU, not shown in FIG. 9, makes an I/O Write signal active (low level) and makes a DMA enable signal inactive (high level), when power is turned on. Consequently, the output of the OR circuit 915 is made active (low level), which leads to clearing of the counter 912. Then, the counter 912 is incremented each time a Memory Write signal input as a write enable signal WE via an input gate 906 to which an enable signal EN which is always active (low level) is provided, makes a low-to-high transition (FIG. 10A). That is, each time normal data is written to the first RAM 901, the counter 912 is incremented.

In the meantime, a Memory Read signal is input as an output enable signal OE via the input gate 906.

When the CPU, which is not shown in FIG. 9, executes a write instruction, address data is first output to an address bus 920. To an input gate 904, the enable signal EN which is always active (low level) is always provided, and the address data on the address bus 920 is always input. This address data is provided to the first RAM 901 and the second RAM 902.

In the meantime, write data is output from the CPU to the data bus 921.

As a result of decoding the address data output to the address bus 920, an address decoder 922 arranged on the output side of the input gate 904 makes a chip select signal CS output from the decoder itself active, when the decoded address is directed to a memory device including the address decoder itself. When the write operation is performed, the write enable signal WE (Memory Write signal) is made active and the output enable signal OE (Memory Read signal) is made inactive.

As a result, the output of an inverter 916 is made active, and the output of the OR circuit 913 is made active.

In the meantime, since the output enable signal OE is made inactive (high level), also the output of the OR circuit 914 is made inactive (high level).

The output of the OR circuit 913 is made active, so that an input gate 905 is enabled, and the write data on the data bus 921 is captured by the first RAM 901.

The first RAM 901 writes the write data input from the data bus 921 via the input gate 905 to the write address specified from the address bus 920 via the input gate 904 in synchronization with the write enable signal WE.

In the meantime, since the output of the OR circuit 913 is made active, input gates 907 and 908 are enabled. Additionally, the output of the OR circuit 914 is made inactive (high level), so that the selector 911 selects a count output value "Q" of the counter 912.

Consequently, the second RAM 902 writes the count output value "Q" of the counter 912 to the same address as the write address specified for the first RAM 901, via the input gate 907 in synchronization with the write enable signal WE (FIG. 10B).

The third RAM 903 writes the value of the write address to the address corresponding to the count output value "Q" of the counter 912, which is input via the selector 911, via the input gate 908 in synchronization with the write enable signal WE (FIG. 10C).

In the configuration shown in FIG. 9 as described above, normal data is written to the write address specified in the first RAM 901 when a write operation is performed, the current count output value "Q" is written to the same address as the write address of the second RAM 902, and the write address is written to the address corresponding to the count output value "Q" in the third RAM 903, when the write operation is performed.

Detailed Operations Performed in the Third Preferred Embodiment When a Read Operation Is Performed When the CPU, which is not shown in FIG. 9, executes a read instruction, address data is first output to an address bus 920. The address data is then provided to the first RAM 901 and the second RAM 902 via the input gate 904.

When the read operation is performed, the write enable signal WE (Memory Write signal) is made inactive and the output enable signal OE (Memory Read signal) is made active.

As a result, the output of the inverter 916 is made inactive (high level), and the output of the OR circuit 913 is made inactive (high level). Conversely, the output of the OR circuit 914 is made active (low level).

Since the output of the OR circuit 913 is made inactive, the input gates 905, 907, and 908 are disabled. In the meantime, since the output of the OR circuit 914 is made active, the output gate is enabled and the selector 911 selects the read data output from the second RAM 902.

The first RAM 901 reads the normal data from the read address specified from the address bus 920 via the input gate 904 in synchronization with the output enable signal OE, and outputs the read data to the selector 910.

The second RAM 902 reads the guarantee bit data, which is the count output value "Q", from the same address as the read address specified for the first RAM 901 in synchronization with the output enable signal OE.

The third RAM 903 reads the guarantee bit data, which is the address data, from the address corresponding to the count output value which is read from the second RAM 902 and input via the selector 911 in synchronization with the output enable signal OE.

A first comparing circuit 918 outputs the result of determination "1" if the current count output value "Q" of the counter 912 is not "0" and the count output value read from the second RAM 902 is smaller than the current count output value "Q" of the counter 912. In other cases, the first comparing circuit 918 outputs the result of determination "0" (A and B of FIG. 1*l*).

Figure 11:
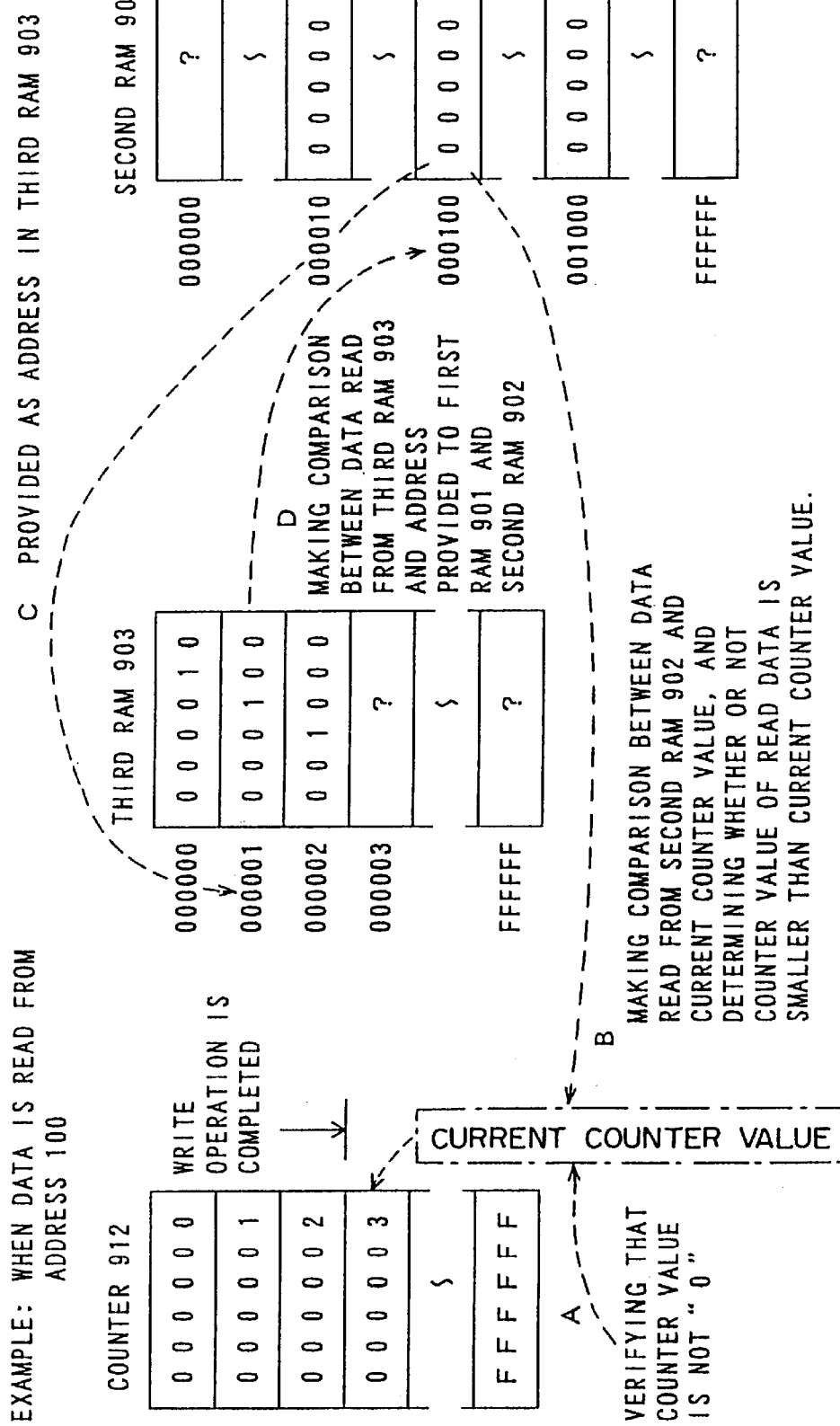
FIG. 11 is a schematic diagram showing the operations performed in the third preferred embodiment (when a read operation is performed).

A second comparing circuit 919 outputs the result of determination "1" if the read address currently specified for the first RAM 901 and the second RAM 902 matches the address data read from the third RAM 903. In other cases, the second comparing circuit 919 outputs the result of determination "0" (C and D of FIG. 11).

An AND circuit 917 outputs the value "1" only when both of the results of determinations made by the first comparing circuit 918 and the second comparing circuit 919 are "1". In other cases, the AND circuit outputs the value "0".

As described above, only when the current count output value "Q" of the counter 912 is not "0", the count output value read from the second RAM 902 is smaller than the current count output value "Q" of the counter 912, and the read address currently specified for the first RAM 901 and the second RAM 902 matches the address data read from the third RAM 903, the AND circuit 917 outputs "1". In other cases, the AND circuit 917 outputs "0".

Here, if no normal data is written to a desired address in the first RAM 901 after power is turned on, the current count output value "Q" of the counter 912 will become "0", or the count output value read from the second RAM 902 will be smaller than the current count output value "Q" of the counter 912, or the read address currently specified for the first RAM 901 and the second RAM 902 will not match the address data read from the third RAM 903. In such a case, the AND circuit outputs "0".

Accordingly, if the output of the AND circuit 917 is "1", the selector 910 selects the read data output from the first RAM 901. If the output of the AND circuit 917 is "0", the selector 910 selects the fixed value "0" (low level), and outputs the selected value to the data bus 921 via the output gate 909. The output gate 909 is enabled at the time of the read operation as described above.

In this way, the fixed value "0" is output from an address in the first RAM 901, whose content is not rewritten, without performing an initialization process for the first RAM 901. As a result, a virtual memory clear operation can be implemented.

For example, if the contents of all the addresses in the first RAM 901 are cleared, the CPU, which is not shown in FIG. 9, makes the I/O write signal active (low level), makes the DMA enable signal inactive (high level), and makes the output of the OR circuit 915 active (low level). Consequently, the counter 912 is cleared. Accordingly, the current count output value "Q" of the counter 912 becomes "0", and the first comparing circuit 918 outputs the result of determination "0" to all of the read addresses. The fixed value "0" is therefore output to the data bus for all of the read addresses.

That is, the entire contents of the first RAM 901 are virtually and instantaneously cleared without performing a memory clear operation for the first RAM 901.

The feature of the third preferred embodiment according to the present invention is that this configuration can be applied to an arbitrary memory element other than a DRAM, whose stored contents are not guaranteed immediately after power is turned on.

Other Preferred Embodiments

According to the above described preferred embodiments, the fixed value "0" is always output from an address in a RAM, whose stored contents are not rewritten. However, the present invention is not limited to this implementation. Namely, not the fixed value "0" but a specific content of a ROM may be output from an address in a RAM, whose stored content is not rewritten, so that the data stored in the ROM becomes default data, and only the contents which are rewritten is read from the RAM. In this way, a programmable program/table ROM, etc. can be implemented.

Furthermore, a memory system is configured by a plurality of parallel RAMs to which the present invention is applied, and each of the plurality of RAMs is switched, so that it becomes possible to store a plurality of states different from a default state. Therefore, also memory management of tasks which use the same address area in a program composed of multiple tasks, can be easily implemented by the switching control of a RAM to which the present invention is applied. In this case, the overlap of a memory area used by tasks can be prevented.

Furthermore, with the above described configuration according to the second preferred embodiment of the present invention, sum check data is used as guarantee bit data. However, the present invention is not limited to this implementation. CRC data, etc. may be used.

According to each of the above described embodiments, a combination of set data of guarantee bit data (corresponding to FIG. 4A or 4D) and a determination value is set for the whole of a memory area, and the whole of the memory area is instantaneously initialized by switching the combination. However, the present invention is not limited to this implementation. Namely, the above described combination of the set data and the determination value is set for respective areas obtained by partitioning a memory area, and the combinations are sequentially switched, thereby instantaneously initializing the respective areas.

What is claimed is:

1. A memory initialization control method for initializing contents stored in a memory, comprising the steps of:

registering a state of an access to a normal data storing circuit for storing normal data, as data of a predetermined bit pattern in an access guarantee data storing circuit comprising a plurality of dynamic random access memories are arranged in parallel; and selectively switching between an output of data registered to the normal data storing circuit and an output of a fixed value preset as an initial value of the normal data storing circuit according to the registered access state.

2. A memory device including a means for initializing contents stored in a memory, comprising:

an access guarantee data storing circuit, which is arranged separately from a normal data storing circuit for storing normal data and comprises dynamic random access memories all of whose bits are "0" or "1" when being powered up, for allocating a 3-bit-width storage area, which is obtained by arranging three dynamic random access memories in parallel, to an address in the normal data storing circuit, and for storing in the allocated 3-bit-width storage area access guarantee data indicating the state of the access to an address in the normal data storing circuit;

a first control circuit for setting access guarantee data corresponding to an access at an address in said access guarantee data storing circuit, which corresponds to a desired address, when the access of the normal data is made to the desired address in said normal data storing circuit; and a second control circuit for determining whether or not to select and output the normal data at the address in said normal data storing circuit, which corresponds to the desired address, based on the access guarantee data stored at the address in said access guarantee data storing circuit, which corresponds to the desired address, when the normal data is read from the desired address in said normal data storing circuit.

3. The memory device according to claim 2, wherein:

said first control circuit sets the access guarantee data including information which indicates that the normal data has been written at the address in said access guarantee data storing circuit, which corresponds to the desired address, when the normal data is written to the desired address in said normal data storing circuit; and said second control circuit selects and outputs the normal data at the address in said normal data storing circuit, which corresponds to the desired address, when the normal data is read from the desired address in said normal data storing circuit, only if the access guarantee data stored at the address in said access guarantee data storing circuit, which corresponds to the desired address, includes the information which indicates that the normal data has been written.

4. The memory device according to claim 3, wherein:

said second control circuit selects and outputs fixed value data when the normal data is read from the desired address in said normal data storing circuit, if the access guarantee data stored at the address in said access guarantee data storing circuit, which corresponds to the desired address, does not include the information which indicates that the normal data has been written.

5. The memory device according to claim 3, wherein:

said second control circuit selects and outputs default data stored in a default data storing circuit when the normal data is read from the desired address in said normal data storing circuit, if the access guarantee data stored at the address in said access guarantee data storing circuit, which corresponds to the desired address, does not include the information which indicates that the normal data has been written.

6. The memory device according to claim 3, wherein:

said first control circuit further sets the access guarantee data including the information which indicates that the normal data has been written at the address in said access guarantee data storing circuit, which corresponds to the desired address, when the normal data is read from the desired address in said normal data storing circuit.

7. The memory device according to claim 3, wherein:

said access guarantee data storing circuit is a dynamic random access memory; and the information which indicates that the normal data has been written, and is included in the access guarantee data, has a data value which does not appear at each address in said access guarantee data storing circuit, when the memory device is powered up.

8. A memory device including a means for initializing contents stored in a memory, comprising:

an access guarantee data storing circuit, which is arranged separately from a normal data storing circuit for storing normal data, for allowing each address corresponding one to one to an address in said normal data storing circuit to be specified, and storing access guarantee data indicating an access state of the normal data to the address in said normal data storing circuit, which corresponds to each address, at each address; and a first control circuit for setting access guarantee data corresponding to an access at an address in said access guarantee data storing circuit, which corresponds to a desired address, when the access of the normal data is made to the desired address in said normal data storing circuit; and a second control circuit for determining whether or not to select and output the normal data at the address in said normal data storing circuit, which corresponds to the desired address, based on the access guarantee data stored at the address in said access guarantee data storing circuit, which corresponds to the desired address, when the normal data is read from the desired address in said normal data storing circuit, wherein said first control circuit sets the access guarantee data including information which indicates that the normal data has been written at the address in said access guarantee data storing circuit, which corresponds to the desired address, when the normal data is written to the desired address in said normal data storing circuit, and said second control circuit selects and outputs the normal data at the address in said normal data storing circuit, which corresponds to the desired address, when the normal data is read from the desired address in said normal data storing circuit, only if the access guarantee data stored at the address in said access guarantee data storing circuit, which corresponds to the desired address, includes the information which indicates that the normal data has been written, and wherein the in formation which indicates that the normal data has been written, and is included in the access guarantee data, is sum check data obtained by performing a sum check operation for the normal data, and said second control circuit performs the sum check operation for read normal data when the normal data is read from the desired address in said normal data storing circuit, and selects and outputs the normal data read from said normal data storing circuit only if a result of the sum check operation matches the sum check data being the access guarantee data stored at the address in said access guarantee data storing circuit, which corresponds to the desired address.

9. A memory device including a means for initializing contents stored in a memory, comprising:

an access guarantee data storing circuit, which is arranged separately from a normal data storing circuit for storing normal data, for allowing each address corresponding one to one to an address in said normal data storing circuit to be specified, and storing access guarantee data indicating an access state of the normal data to the address in said normal data storing circuit, which corresponds to each address, at each address; and a first control circuit for setting access guarantee data corresponding to an access at an address in said access guarantee data storing circuit, which corresponds to a desired address, when the access of the normal data is made to the desired address in said normal data storing circuit; and a second control circuit for determining whether or not to select and output the normal data at the address in said normal data storing circuit, which corresponds to the desired address, based on the access guarantee data stored at the address in said access guarantee data storing circuit, which corresponds to the desired address, when the normal data is read from the desired address in said normal data storing circuit, wherein said first control circuit sets the access guarantee data including information which indicates that the normal data has been written at the address in said access guarantee data storing circuit, which corresponds to the desired address, when the normal data is written to the desired address in said normal data storing circuit, and said second control circuit selects and outputs the normal data at the address in said normal data storing circuit, which corresponds to the desired address, when the normal data is read from the desired address in said normal data storing circuit, only if the access guarantee data stored at the address in said access guarantee data storing circuit, which corresponds to the desired address, includes the information which indicates that the normal data has been written, wherein the information which indicates that the normal data has been written, and is included in the access guarantee data, is cyclic redundancy code data obtained by performing a cyclic redundancy code operation for the normal data, and said second control circuit performs the cyclic redundancy code operation for read normal data when the normal data is read from the desired address in said normal data storing circuit, and selects and outputs the normal data read from said normal data storing circuit only if a result of the cyclic redundancy code operation matches the cyclic redundancy code data being the access guarantee data stored at the address in said access guarantee data storing circuit, which corresponds to the desired address.

10. A memory device including a means for initializing contents stored in a memory, comprising:

an access guarantee data storing circuit, which is arranged separately from a normal data storing circuit for storing normal data, for allowing each address corresponding one to one to an address in said normal data storing circuit to be specified, and storing access guarantee data indicating an access state of the normal data to the address in said normal data storing circuit, which corresponds to each address, at each address;

a first control circuit for setting access guarantee data corresponding to an access at an address in said access guarantee data storing circuit, which corresponds to a desired address, when the access of the normal data is made to the desired address in said normal data storing circuit; and a second control circuit for determining whether or not to select and output the normal data at the address in said normal data storing circuit, which corresponds to the desired address, based on the access guarantee data stored at the address in said access guarantee data storing circuit, which corresponds to the desired address, when the normal data is read from the desired address in said normal data storing circuit; and a control data switching circuit for switching a combination of a data value of the information which indicates that the normal data has been written, and a determination value by which said second control circuit detects the information which indicates that the normal data has been written, among a plurality of combinations, wherein entire contents stored in said normal data storing circuit are instantaneously cleared by the switching operation performed by said control data switching circuit, wherein said first control circuit sets the access guarantee data including information which indicates that the normal data has been written at the address in said access guarantee data storing circuit, which corresponds to the desired address, when the normal data is written to the desired address in said normal data storing circuit; and said second control circuit selects and outputs the normal data at the address in said normal data storing circuit, which corresponds to the desired address, when the normal data is read from the desired address in said normal data storing circuit, only if the access guarantee data stored at the address in said access guarantee data storing circuit, which corresponds to the desired address, includes the information which indicates that the normal data has been written.

11. A memory device including a means for initializing contents stored in a memory, comprising:

an access guarantee data storing circuit, which is arranged separately from a normal data storing circuit for storing normal data, for allowing each address corresponding one to one to an address in said normal data storing circuit to be specified, and storing access guarantee data indicating an access state of the normal data to the address in said normal data storing circuit, which corresponds to each address; at each address, and a first control circuit for setting access guarantee data corresponding to an access at an address in said access guarantee data storing circuit, which corresponds to a desired address, when the access of the normal data is made to the desired address in said normal data storing circuit; and a second control circuit for determining whether or not to select and output the normal data at the address in said normal data storing circuit, which corresponds to the desired address, based on the access guarantee data stored at the address in said access guarantee data storing circuit, which corresponds to the desired address, when the normal data is read from the desired address in said normal data storing circuit, wherein said first control circuit sets the access guarantee data including information which indicates that the normal data has been written at the address in said access guarantee data storing circuit, which corresponds to the desired address, when the normal data is written to the desired address in said normal data storing circuit, and said second control circuit selects and outputs the normal data at the address in said normal data storing circuit, which corresponds to the desired address, when the normal data is read from the desired address in said normal data storing circuit, only if the access guarantee data stored at the address in said access guarantee data storing circuit, which corresponds to the desired address, includes the information which indicates that the normal data has been written, and wherein a combination of a data value of the information which indicates that the normal data has been written, and a determination value by which said second control circuit detects the information which indicates that the normal data has been written, is respectively set and switched for each of a plurality of address area in said normal data storing circuit and said access guarantee data storing circuit, so that contents stored in each of the plurality of address areas is instantaneously cleared.

12. A memory device including a means for initializing contents stored in a memory, comprising:

a counter circuit for incrementing its value each time normal data is written to a normal data storing circuit for storing the normal data;

a count value storing circuit, which is arranged separately from said normal data storing circuit, for allowing each address corresponding one to one to an address in said normal storing circuit to be specified, and storing a count value of said counter circuit at each address;

an address data storing circuit, which is arranged separately from said normal data storing circuit and said count value storing circuit, for allowing an address corresponding one to one to the count value of said counter circuit to be specified, and storing address data corresponding to an address specified for said normal data storing circuit;

a third control circuit for writing a current count value of said counter circuit at the address in said count value storing circuit, which corresponds to a desired address, when the normal data is written to the desired address in said normal data storing circuit;

a fourth control circuit for writing the address data corresponding to the desired address to an address corresponding to the current count value of said counter circuit in said address data storing circuit, when the normal data is written to the desired address in said normal data storing circuit; and a fifth control circuit for determining whether or not to select and output the normal data at the address in said normal data storing circuit, which corresponds to the desired address, when the normal data is read from the desired address in said normal data storing circuit, based on the current count value of said counter circuit, the count value stored at the address in said count value storing circuit, which corresponds to the desired address, and the address data stored at the address in said address data storing circuit, which corresponds to the count value.

13. The memory device according to claim 12, wherein:

said fifth control circuit selects and outputs the normal data read from said normal data storing circuit when the normal data is read from the desired address in said normal data storing circuit, only if the current count value of said counter circuit is not "0", the count value stored at the address in said count value storing circuit, which corresponds to the desired address, is smaller than the current count value of said counter circuit, and an address indicated by the address data stored at the address in said address data storing circuit, which corresponds to the stored count value, matches the desired address.

14. A memory initialization control method for initializing contents stored in a memory, comprising the steps of:

registering a state of an access to a normal data storing circuit for storing normal data, as access guarantee data whose bit pattern is predetermined in an access guarantee data storing circuit arranged separately from the normal data storing circuit, where two dynamic random access memories are arranged in parallel; and selectively switching between an output of data registered to the normal data storing circuit and an output of a fixed value preset as an initial value of the normal data storing circuit based on the access guarantee data stored at an address in the access guarantee data storing circuit, which corresponds to a desired address, when the normal data is read from the desired address in the normal data storing circuit.

15. A memory device according to claim 2, further comprising:

a CPU; and a guarantee bit comparing/generating circuit, wherein two bits among 3-bit access guarantee data are used to indicate whether an initial state of the dynamic random access memories is "0" or "1" and to indicate the state of the access to the normal data storing circuit and a remaining 1 bit is used to change a bit pattern of the access guarantee bit data indicating the access state according to a control state set in said guarantee bit comparing/generating circuit.

16. A memory device according to claim 15, wherein:

when the normal data storing circuit is initialized, the CPU changes a control state set in the guarantee bit comparing/generating circuit from a first to a second state or from the second to the first state, and the guarantee bit comparing/generating circuit sets the access guarantee bit data comprised of a bit pattern different from the bit pattern of the access guarantee bit data used in the control state before being changed;

when the control state is changed, the data in said access guarantee data storing circuit is recognized as initial data for registering the access state; and said second controlling circuit selects the data preset as the initial value of the normal data storing circuit if the initial data is registered to an address in said access guarantee data storing circuit, which corresponds to a desired address, when the normal data is read from the desired address in the normal data storing circuit, and reads the data in the normal data storing circuit if the initial data is not registered, so that virtual initialization of the normal data storing circuit can be repeated in any case, not limited to in a case where the device is powered up or reset.

* * * * *